(12) United States Patent
Ohno et al.

(10) Patent No.: US 9,646,829 B2
(45) Date of Patent: May 9, 2017

(54) MANUFACTURING METHOD OF SEMICONDUCTOR DEVICE

(75) Inventors: Shinji Ohno, Atsugi (JP); Yuichi Sato, Isehara (JP); Junichi Koezuka, Tochigi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 73 days.

(21) Appl. No.: 13/402,940

(22) Filed: Feb. 23, 2012

(65) Prior Publication Data

US 2012/0225543 A1    Sep. 6, 2012

(30) Foreign Application Priority Data

Mar. 4, 2011    (JP) .................... 2011-047879

(51) Int. Cl.
*H01L 21/20*    (2006.01)
*H01L 21/36*    (2006.01)
(Continued)

(52) U.S. Cl.
CPC .. *H01L 21/02554* (2013.01); *H01L 21/02565* (2013.01); *H01L 21/02631* (2013.01); *H01L 29/7869* (2013.01)

(58) Field of Classification Search
CPC ......... H01L 21/02554; H01L 21/02565; H01L 21/02631; H01L 29/045; H01L 29/7869;
(Continued)

(56) References Cited

U.S. PATENT DOCUMENTS

| 5,528,032 A | 6/1996 | Uchiyama |
| 5,731,856 A | 3/1998 | Kim et al. |

(Continued)

FOREIGN PATENT DOCUMENTS

| EP | 1737044 A | 12/2006 |
| EP | 2159845 A | 3/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Charles Garber
*Assistant Examiner* — Abdulfattah Mustapha
(74) *Attorney, Agent, or Firm* — Robinson Intellectual Property Law Office; Eric J. Robinson

(57) ABSTRACT

A method for manufacturing a highly reliable semiconductor device with less change in threshold voltage is provided. An insulating film from which oxygen can be released by heating is formed in contact with an oxide semiconductor layer, and light irradiation treatment is performed on a gate electrode or a metal layer formed in a region which overlaps with the gate electrode, so that oxygen is added into the oxide semiconductor layer in a region which overlaps with the gate electrode. Accordingly, oxygen vacancies or interface states in the oxide semiconductor layer in a region which overlaps with the gate electrode can be reduced.

18 Claims, 14 Drawing Sheets

(51) Int. Cl.
*H01L 21/02* (2006.01)
*H01L 29/786* (2006.01)

(58) Field of Classification Search
CPC ........... H01L 29/78693; H01L 29/2206; H01L 29/221; H01L 29/24; H01L 29/66969; H01L 29/263; H01L 29/78696
USPC ................. 438/102–104, 479, 795; 257/411, 257/E21.09, E21.347, E21.349, E21.461
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,821,002 | B2 | 10/2010 | Yamazaki et al. |
| 8,049,225 | B2 | 11/2011 | Yamazaki et al. |
| 8,241,949 | B2 | 8/2012 | Miyanaga |
| 8,343,817 | B2 | 1/2013 | Miyairi et al. |
| 8,450,144 | B2 | 5/2013 | Sakata et al. |
| 8,729,547 | B2 | 5/2014 | Miyairi et al. |
| 8,785,242 | B2 | 7/2014 | Yamazaki et al. |
| 8,946,703 | B2 | 2/2015 | Miyairi et al. |
| 8,952,378 | B2 | 2/2015 | Miyanaga |
| 9,082,857 | B2 | 7/2015 | Yamazaki et al. |
| 9,105,659 | B2 | 8/2015 | Yamazaki et al. |
| 9,166,058 | B2 | 10/2015 | Miyairi et al. |
| 9,236,456 | B2 | 1/2016 | Miyairi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0081848 | A1* | 4/2006 | Niisoe et al. ................... 257/72 |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1* | 3/2007 | Akimoto et al. ............. 438/795 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0102589 | A1* | 5/2008 | Matsuda ................ H01L 29/665 438/308 |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0142887 | A1 | 6/2009 | Son et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0305468 | A1* | 12/2009 | Jung et al. .................... 438/151 |
| 2010/0025676 | A1* | 2/2010 | Yamazaki et al. ............. 257/43 |
| 2010/0051949 | A1 | 3/2010 | Yamazaki et al. |
| 2010/0059746 | A1* | 3/2010 | Itai ................................. 257/43 |
| 2010/0065844 | A1 | 3/2010 | Tokunaga |
| 2010/0085081 | A1 | 4/2010 | Ofuji et al. |
| 2010/0092800 | A1 | 4/2010 | Itagaki et al. |
| 2010/0109002 | A1 | 5/2010 | Itagaki et al. |
| 2010/0244020 | A1 | 9/2010 | Sakata et al. |
| 2011/0024750 | A1* | 2/2011 | Yamazaki et al. ............. 257/57 |
| 2011/0133179 | A1* | 6/2011 | Yamazaki ....................... 257/43 |
| 2011/0140205 | A1* | 6/2011 | Sakata ................ H01L 29/7869 257/411 |
| 2011/0212569 | A1* | 9/2011 | Yamazaki et al. ............. 438/104 |
| 2011/0284844 | A1 | 11/2011 | Endo et al. |
| 2015/0144947 | A1 | 5/2015 | Miyanaga |
| 2015/0303280 | A1 | 10/2015 | Yamazaki et al. |
| 2016/0079438 | A1 | 3/2016 | Miyairi et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |

(56) References Cited

FOREIGN PATENT DOCUMENTS

| | | |
|---|---|---|
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008-060419 | 3/2008 |
| JP | 2010-062548 A | 3/2010 |
| JP | 2010-062549 A | 3/2010 |
| JP | 2010-080952 A | 4/2010 |
| JP | 2010-251731 A | 11/2010 |
| JP | 2011-040731 A | 2/2011 |
| WO | WO-2004/114391 | 12/2004 |
| WO | WO-2011/007682 | 1/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432 pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006 vol. 18, No. 3, pp. 339-342.

Tsuda.K et al., "Ultra Low Power Consumption Technologies for Mobile TFT-LCDs ,", IDW '02 Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined with Ultra Low-Power Driving Technology,", SID Digest '09 : SID International Symposium Digest of Technical Papers, May 31, 2009, pp. 395-398.
Lee.H et al., "Current Status of, Challenges to, and Perspective view of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel, YbFe2O4, and YbFe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of The Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

MANUFACTURING METHOD OF SEMICONDUCTOR DEVICE

BACKGROUND OF THE INVENTION

1. Field of the Invention

The present invention relates to a manufacturing method of a semiconductor device.

2. Description of the Related Art

Semiconductor elements such as transistors using silicon for their semiconductor layers (hereinafter abbreviated as silicon semiconductor elements) have been used for a variety of semiconductor devices and been essential for manufacturing semiconductor devices. To manufacture large-size semiconductor devices, a method in which a material such as glass, which is suitable for increasing in size, is used for substrates and thin-film silicon which can be deposited in a large area is used for semiconductor layers has been widely employed.

In such semiconductor elements using thin-film silicon, the semiconductor layers need to be formed at temperatures less than or equal to the upper temperature limits of their substrates, and thus, amorphous silicon and polysilicon which can be formed at relatively low temperatures have been widely used.

Amorphous silicon has advantages of being able to be deposited in a large area and allowing semiconductor elements having uniform element characteristics to be manufactured by a simple process at relatively low cost; thus, amorphous silicon has been widely used for semiconductor devices with a large area, such as solar batteries. Meanwhile, amorphous silicon has a disadvantage of low electron mobility owing to its amorphous structure which causes a scattering of electrons at grain boundaries.

To make up for the disadvantage, polysilicon, that has a higher mobility realized by irradiating amorphous silicon with laser or the like to be locally dissolved and recrystallized, or by crystallization using a catalytic element, has been widely used in semiconductor devices such as liquid crystal displays in which both large area and high carrier mobility need to be achieved.

In addition, in recent years, oxide semiconductors that are metal oxides having semiconductor characteristics have attracted attention as novel semiconductor layer materials having high mobility, which is an advantage of polysilicon, and uniform element characteristics, which are an advantage of amorphous silicon.

As semiconductor devices such as transistors using oxide semiconductors as their semiconductor layers (hereinafter abbreviated as oxide semiconductor devices), for example, as in Patent Document 1, a thin film transistor manufactured using tin oxide, indium oxide, zinc oxide, or the like has been proposed.

REFERENCE

Patent Document 1: Japanese Published Patent Application No. 2007-123861

SUMMARY OF THE INVENTION

However, as for oxide semiconductor devices, a problem of fluctuation of electrical characteristics (low reliability) is known, though there are a variety of advantages as described above. For example, the threshold voltage of the transistor is changed by a bias-temperature test (BT test). Note that in this specification, the "threshold voltage" refers to a gate voltage which is needed to turn on the transistor.

One cause of the fluctuation of electrical characteristics of the oxide semiconductor device is an oxygen vacancy in the oxide semiconductor layer or an interface state (also called a surface state) which is attributable to lattice mismatch in the interface between the oxide semiconductor layer and the gate insulating film.

The oxygen vacancy or the interface state in the oxide semiconductor layer leads to generation of a carrier (excess electron); therefore, the threshold voltage is more likely to be changed as the number of oxygen vacancies or interface states is increased in the oxide semiconductor layer in a region which overlaps with the gate electrode.

The present invention was made under the foregoing technical background. It is an object of one embodiment of the present invention to provide a method for manufacturing a highly reliable semiconductor device with less change in threshold voltage.

In order to solve the above-described problem, in one embodiment of the present invention, an insulating film from which oxygen can be released by heating is formed in contact with an oxide semiconductor layer, and light irradiation treatment is performed on a gate electrode or a metal layer formed in a region which overlaps with the gate electrode. Accordingly, the insulating layer in a region which overlaps with the gate electrode is heated and thus adds oxygen into the oxide semiconductor layer in a region which overlaps with the gate electrode.

That is, one embodiment of the present invention is a method for manufacturing a semiconductor device in which a gate electrode is formed over a substrate having an insulating surface, an insulating layer from which oxygen can be released by heating is formed over the gate electrode, an oxide semiconductor layer is formed in contact with the insulating layer, and light irradiation treatment is performed on the gate electrode to add oxygen from the insulating layer in a region which overlaps with the gate electrode into the oxide semiconductor layer, whereby the number of oxygen vacancies and the number of interface states in the oxide semiconductor layer in a region which overlaps with the gate electrode are reduced.

Further, one embodiment of the present invention is a method for manufacturing a semiconductor device in which an oxide semiconductor layer is formed over a substrate having an insulating surface, an insulating layer from which oxygen can be released by heating is formed over the oxide semiconductor layer, a gate electrode is formed over the insulating layer, and light irradiation treatment is performed on the gate electrode to add oxygen from the insulating layer in a region which overlaps with the gate electrode to the oxide semiconductor layer, whereby the number of oxygen vacancies and the number of interface states in the oxide semiconductor layer in a region which overlaps with the gate electrode are reduced.

According to the above-described embodiment of the present invention, the insulating layer in the region which overlaps with the gate electrode is also heated by the light irradiation treatment on the gate electrode, so that oxygen in the insulating layer is detached. Since the insulating layer is formed in contact with the oxide semiconductor layer, detached oxygen can be added into the oxide semiconductor layer in the region which overlaps with the gate electrode, which results in a reduction in the number of oxygen vacancies or interface states in the oxide semiconductor layer in the region which overlaps with the gate electrode.

In this manner, according to the above-described embodiment of the present invention, a highly reliable semiconductor device with less change in threshold voltage can be manufactured.

Further, one embodiment of the present invention is a method for manufacturing a semiconductor device in which an anti-oxidation layer containing at least one of molybdenum nitride, tungsten nitride, titanium nitride, tantalum nitride, and aluminum nitride is formed on a surface of the gate electrode, which is in contact with the insulating layer in the above-described embodiment of the present invention.

According to the above-described embodiment of the present invention, oxidation of the gate electrode on the side which is in contact with the insulating layer due to oxygen released from the insulating layer by the light irradiation treatment can be suppressed.

To reduce the size of semiconductor devices, it is important to reduce the thickness of an insulating layer between a gate electrode and a semiconductor layer; however, a metal oxide film with high resistance formed by oxidation of the gate electrode leads to an increase in the thickness of the insulating layer in some cases.

Hence, with the anti-oxidation layer which suppresses oxidation of the gate electrode and is formed according to the above-described embodiment of the present invention, a downsized semiconductor device with high reliability can be manufactured.

One embodiment of the present invention is a method for manufacturing a semiconductor device in which a gate electrode is formed over a substrate having an insulating surface, a gate insulating layer is formed over the gate electrode, an oxide semiconductor layer is formed over the gate insulating layer, an insulating layer from which oxygen can be released by heating is formed in contact with the oxide semiconductor layer so as to overlap with the gate electrode, a metal layer is formed over the insulating layer so as to overlap with the gate electrode and the insulating layer, and light irradiation treatment is performed on the metal layer to add oxygen from the insulating layer in a region which overlaps with the gate electrode to the oxide semiconductor layer, whereby the number of oxygen vacancies and the number of interface states in the oxide semiconductor layer in a region which overlaps with the gate electrode are reduced.

Further, one embodiment of the present invention is a method for manufacturing a semiconductor device in which an island-shaped metal layer is formed over a substrate having an insulating surface, an insulating layer from which oxygen can be released by heating is formed over the metal layer, an oxide semiconductor layer is formed in contact with the insulating layer, a gate insulating layer is formed over the oxide semiconductor layer, a gate electrode is formed over the gate insulating layer so as to overlap with the metal layer and the insulating layer, and light irradiation treatment is performed on the metal layer to add oxygen from the insulating layer in a region which overlaps with the metal layer to the oxide semiconductor layer, whereby the number of oxygen vacancies and the number of interface states in the oxide semiconductor layer in a region which overlaps with the gate electrode are reduced.

According to the above-described embodiment of the present invention, the insulating layer in the region which overlaps with the metal layer is also heated by the light irradiation treatment on the metal layer, so that oxygen in the insulating layer is detached. Since the insulating layer is formed in contact with the oxide semiconductor layer, detached oxygen can be added into the oxide semiconductor layer in the region which overlaps with the metal layer, which results in a reduction in the number of oxygen vacancies or interface states in the oxide semiconductor layer in the region which overlaps with the gate electrode.

The metal layer is not directly involved in operation of the semiconductor device unlike the gate electrode; thus, any material which generates heat effectively by light irradiation treatment can be used for the metal layer regardless of its resistance or thickness. Accordingly, a highly reliable semiconductor device with less change in threshold voltage can be manufactured at lower cost.

The metal layer also acts to suppress incidence of external light into the oxide semiconductor layer in the region which overlaps with the gate electrode (acts as a so-called light-blocking film) as well as to heat the insulating layer. Accordingly, a highly reliable semiconductor device with less change in characteristics due to light incidence from outside can be manufactured.

Further, one embodiment of the present invention is a method for manufacturing a semiconductor device in which a layer having an optical absorptance of 60% or more in the wavelength region from 400 nm to 1000 nm both inclusive is formed as the metal layer in the above-described embodiment of the present invention.

According to the above-described embodiment of the present invention, the metal layer can efficiently absorb irradiated light to generate light, so that oxygen can be added efficiently into the oxide semiconductor layer in the region which overlaps with the gate electrode even by light irradiation at low energy. Accordingly, power consumption and frequency of maintenance of an apparatus for light irradiation can be reduced.

Accordingly, a highly reliable semiconductor device with less change in threshold voltage can be manufactured at lower cost.

Further, one embodiment of the present invention is a method for manufacturing a semiconductor device in which the insulating layer is formed by a sputtering method using oxygen or a mixed gas of oxygen and argon in the above-described embodiment of the present invention.

According to the above-described embodiment of the present invention, a sufficient number of oxygen atoms are contained in the insulating layer, whereby oxygen vacancies or interface states in the oxide semiconductor layer in the region which overlaps with the gate electrode can be effectively reduced by performing the light irradiation treatment to heat the insulating layer.

Accordingly, a highly reliable semiconductor device with less change in threshold voltage can be manufactured.

The expression "B is formed over A" or "B is formed on A" explicitly described in this specification, etc. means not only the case where B is formed on and in direct contact with A but also the case where A and B are not in direct contact with each other, i.e., the case where another object is provided between A and B. Here, A and B each denote an object (e.g., device, element, circuit, wiring, electrode, terminal, film, or layer).

Therefore, for example, the explicitly described expression that a layer B is formed on or over a layer A includes both the cases where the layer B is formed on and in direct contact with the layer A and where another layer (e.g., a layer C or a layer D) is formed on and in direct contact with the layer A and the layer B is formed on and in direct contact with the layer. Note that the layer (e.g., the layer C or the layer D) may be a single layer or a plurality of layers.

In this specification, ordinal numbers such as "first", "second", and "third" are used in order to avoid confusion among elements, and do not give a limitation on the number of elements.

Functions of a "source" and a "drain" of a transistor in this specification are sometimes switched when a transistor of the opposite polarity is used or when the direction of current flowing is changed in circuit operation, for example. Therefore, the terms "source" and "drain" can be switched in this specification.

According to one embodiment of the present invention, a highly reliable semiconductor device with less change in threshold voltage in which oxygen vacancies or interface states in an oxide semiconductor layer in a region which overlaps with a gate electrode are reduced can be provided.

DETAILED DESCRIPTION OF THE INVENTION

Figure 1A:
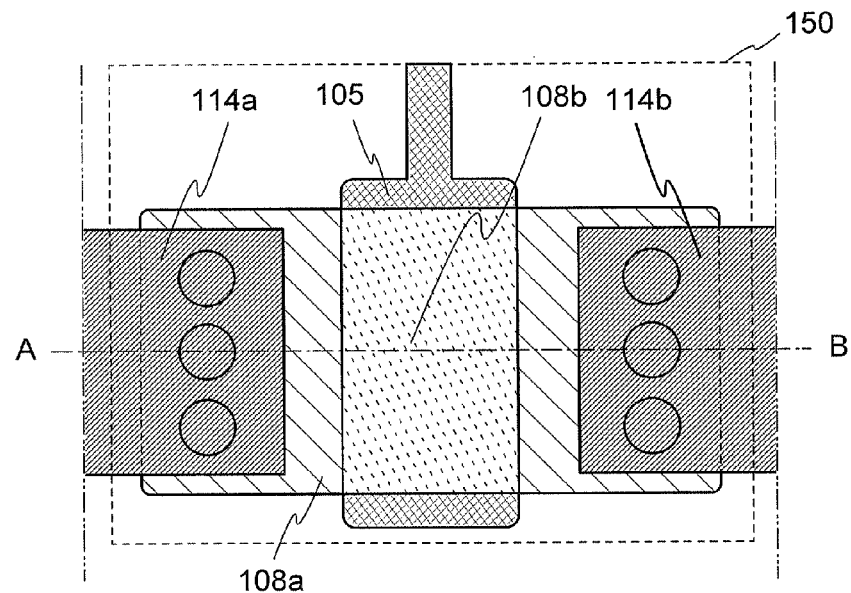
FIGS. 1A and 1B illustrate a structure of a semiconductor device described in Embodiment 1.

Hereinafter, embodiments of the present invention are described in detail using the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. In the structures of the present invention described below, the same portions or portions having similar functions are denoted by the same reference numerals throughout the drawings, and description thereof is not repeated.

[Embodiment 1]

In Embodiment 1, a manufacturing method of a semiconductor device according to an embodiment of the present invention is described using FIGS. 1A and 1B, and FIGS. 2A to 2D, FIGS. 3A to 3C, and FIG. 4.

<Structure of Semiconductor Device According to this Embodiment>

Figure 1B:
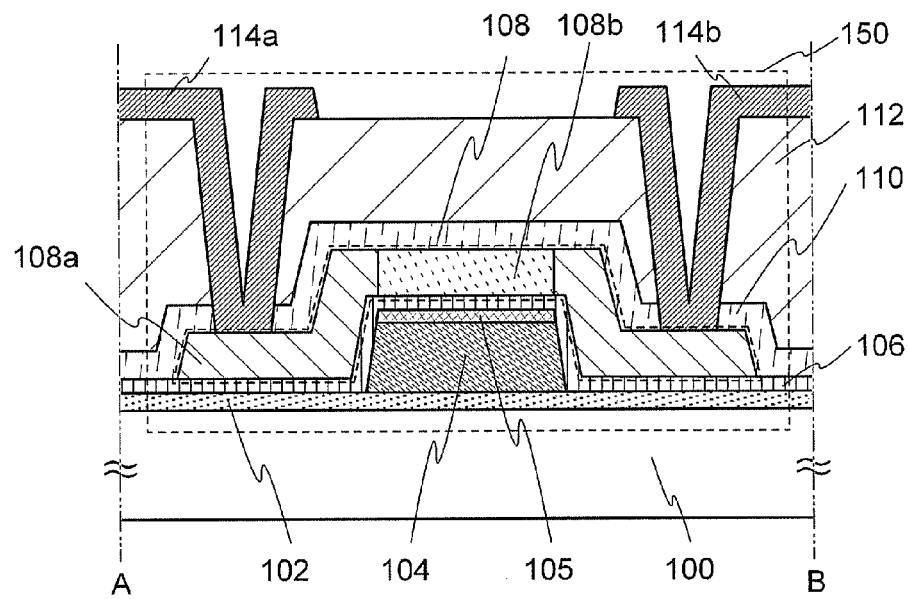

FIGS. 1A and 1B illustrate an example of a structure of a semiconductor device manufactured according to a method of this embodiment, a bottom-gate transistor 150: FIG. 1A is a top view of the transistor 150 and FIG. 1B is a cross-sectional schematic diagram taken along a dashed line A-B in FIG. 1A. In the top view of FIG. 1A, only patterned film(s) and/or layer(s) are shown for easy understanding of the structure. Although the manufacturing method is described on the case where the transistor 150 is an n-channel transistor whose carriers are electrons in this embodiment, the transistor 150 is not limited to the n-channel transistor.

The transistor 150 shown in FIGS. 1A and 1B includes a substrate 100, a base layer 102 formed over the substrate 100, a gate electrode 104 formed over the base layer 102, an anti-oxidation layer 105 formed over the gate electrode 104, an insulating layer 106 formed over the base layer 102, the gate electrode 104, and the anti-oxidation layer 105, an oxide semiconductor layer 108 which includes a low resistance region 108a functioning as a source region (or a drain region) and a channel formation region 108b and is formed over the insulating layer 106, a first interlayer insulating layer 110 formed over the insulating layer 106 and the oxide semiconductor layer 108, a second interlayer insulating layer 112 formed over the first interlayer insulating layer 110, and a source electrode 114a and a drain electrode 114b which are electrically connected to the low resistance region 108a through openings in the first interlayer insulating layer 110 and the second interlayer insulating layer 112.

<Manufacturing Method of Semiconductor Device According to this Embodiment>

A method for manufacturing the transistor 150 is described below using FIGS. 2A to 2D, FIGS. 3A to 3C, and FIG. 4.

Figure 2A:
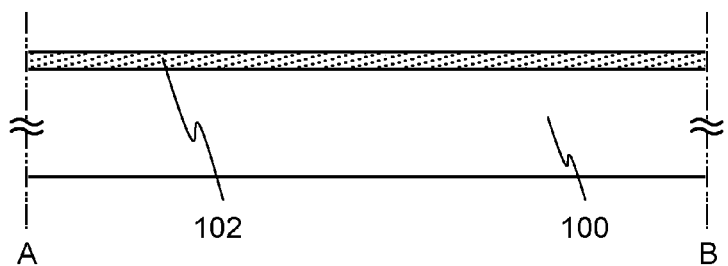
FIGS. 2A to 2D illustrate a method for manufacturing the semiconductor device described in Embodiment 1.

First, the base layer 102 is formed over the substrate 100 (see FIG. 2A).

Any substrate can be used as the substrate 100 as long as the substrate has an insulating surface. For example, a non-alkali glass substrate such as an aluminosilicate glass substrate, an aluminoborosilicate glass substrate, or a barium borosilicate glass substrate can be used. Such a glass substrate is suitable for increasing in size, and glass substrates of G10 size (2850 mm×3050 mm), G11 size (3000 mm×3320 mm), and the like have been manufactured; thus, the semiconductor device according to one embodiment of the present invention can be mass-produced at low cost. Alternatively, as the substrate 100, an insulating substrate formed of an insulator, such as a quartz substrate or a sapphire substrate, a semiconductor substrate which is formed using a semiconductor material such as silicon and has a surface covered with an insulating material, or a conductive substrate which is formed of a conductor such as metal or stainless steel and has a surface covered with an insulating material can be used. Although there is no particular limitation on the thickness of the substrate 100, it is preferable that the thickness of the substrate 100 be equal to or less than 3 mm, further preferably equal to or less than 1 mm for a reduction in thickness and weight of the semiconductor device.

It is preferable that the substrate 100 have light-transmitting properties in the case where light irradiation treatment is carried out through the substrate 100. Specifically, it is preferable that the light transmittance of the substrate 100 in the wavelength region from 400 nm to 700 nm both inclusive be greater than or equal to 70%. It is further preferable that the light transmittance of the substrate 100 in the wavelength region from 400 nm to 700 nm both inclusive be greater than or equal to 90%.

As an example, a non-alkali glass substrate with a thickness of 0.7 mm and a light transmittance of greater than or equal to 80% in the wavelength region from 400 nm to 700 nm both inclusive may be used as the substrate 100.

The base layer 102 prevents impurity diffusion from the substrate 100; silicon oxide ($SiO_2$), silicon nitride (SiN), silicon oxynitride (SiON), silicon nitride oxide (SiNO), aluminum oxide ($AlO_2$), aluminum nitride (AlN), aluminum oxynitride (AlON), aluminum nitride oxide (AlNO), or the like may be deposited by a known method such as a CVD method such as a plasma-enhanced CVD method, a PVD method, or a sputtering method. The base layer 102 may have a single-layer structure or a stacked-layer structure. In the case of a stacked-layer structure, the above films may be stacked to form the base layer 102.

Here, silicon oxynitride contains more oxygen than nitrogen in composition: for example, silicon oxynitride contains oxygen, nitrogen, silicon, and hydrogen at concentrations ranging from 50 atomic % to 70 atomic % both inclusive, from 0.5 atomic % to 15 atomic % both inclusive, from 25 atomic % to 35 atomic % both inclusive, and from 0 atomic % to 10 atomic % both inclusive, respectively. The above concentrations are concentrations when measured using Rutherford backscattering spectrometry (RBS) or hydrogen forward scattering spectrometry (HFS). In addition, the total of the percentages of the constituent elements does not exceed 100 atomic %.

There is no particular limitation on the thickness of the base layer 102; for example, the base layer 102 preferably has a thickness of greater than or equal to 10 nm and less than or equal to 500 nm. When the base layer 102 is thinner than 10 nm, the base layer 102 might not be formed in part of the region because of in-plane thickness distribution attributed to a deposition apparatus; on the other hand, when the base layer 102 is thicker than 500 nm, deposition rate thereof or a manufacturing cost might be increased.

As an example, 100-nm-thick silicon oxide or silicon nitride may be deposited by a plasma-enhanced CVD method to form the base layer 102.

The base layer 102 is not necessarily provided in the case where another corresponding anti-impurity-diffusion layer is provided on a surface of the substrate 100. The same is applied in the case where another corresponding anti-impurity-diffusion layer is provided between the oxide semiconductor layer 108 and the substrate 100.

Figure 2B:
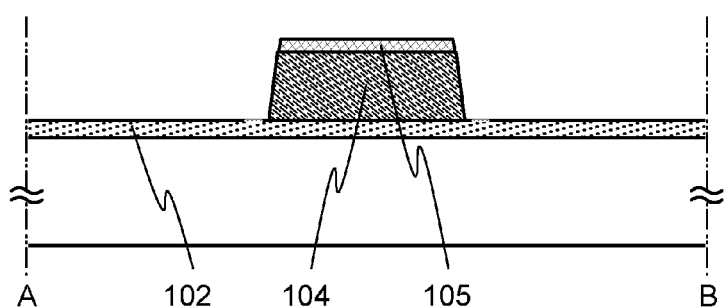

Next, the gate electrode 104 and the anti-oxidation layer 105 are formed over the base layer 102 (see FIG. 2B). The gate electrode 104 and the anti-oxidation layer 105 can be formed as follows: a layer for the gate electrode 104 and a layer for the anti-oxidation layer 105 are formed over the base layer 102 and partly removed by a known method such as a dry etching method or a wet etching method using a photoresist mask. Although the gate electrode 104 and the anti-oxidation layer 105 are separately described for convenience of explanation in this specification, etc., the anti-oxidation layer 105 can be regarded as part of the gate electrode 104.

As the gate electrode 104, for example, a layer formed of at least a metal film or an alloy film containing tantalum (Ta), tungsten (W), titanium (Ti), molybdenum (Mo), aluminum (Al), copper (Cu), chromium (Cr), or neodymium (Nd) as its main component or a nitride film of such a metal or an alloy thereof by a known method such as a sputtering method or an evaporation method may be used.

There is no particular limitation on the thickness of the gate electrode 104; it is preferable to have a thickness of greater than or equal to 10 nm and less than or equal to 500 nm, for example. When the gate electrode 104 is thinner than 10 nm, the gate electrode 104 might not be formed in part of the region because of in-plane thickness distribution attributed to a deposition apparatus; on the other hand, when the gate electrode 104 is thicker than 500 nm, deposition rate thereof or a manufacturing cost might be increased.

As an example, tungsten may be deposited to a thickness of 300 nm by a sputtering method to form the gate electrode 104.

In the case where an element whose light reflectance is high, such as aluminum or copper, is used for the gate electrode 104, it is necessary to form a layer whose light absorptance is high on a surface to be irradiated with light by light irradiation treatment in order to suppress reflection of light. Specifically, in the case where a layer whose light reflectance in the wavelength region from 400 nm to 1000 nm both inclusive is greater than or equal to 50% (hereinafter abbreviated as a high-reflectivity layer) is used as part of the gate electrode 104, it is preferable to provide a layer whose light absorptance in the wavelength region from 400 nm to 1000 nm both inclusive is greater than or equal to 60% (hereinafter abbreviated as a high-absorptivity layer) between the high-reflectivity layer and the base layer 102 and/or between the high-reflectivity layer and the anti-oxidation layer 105.

As an example, a stacked-layer structure in which 100-nm-thick tungsten or 100-nm-thick titanium is deposited on a top surface and a bottom surface of 300-nm-thick aluminum by a sputtering method, a stacked-layer structure in which 100-nm-thick tungsten or 100-nm-thick titanium is deposited on a surface (a light incidence surface at light irradiation treatment) of 300-nm-thick aluminum by a sputtering method, or the like may be used as the gate electrode 104. In the case where a metal whose heat resistance is low, such as aluminum, is used as part of the gate electrode 104, a semiconductor device described in this specification needs to be formed at temperatures under the upper temperature limit of the gate electrode 104.

As the anti-oxidation layer 105, for example, a layer formed of at least one of molybdenum nitride, tungsten nitride, titanium nitride, and tantalum nitride by a known method such as a sputtering method or an evaporation method can be used.

There is no particular limitation on the thickness of the anti-oxidation layer 105; it is preferable to have a thickness of greater than or equal to 5 nm and less than or equal to 100 nm, for example. When the anti-oxidation layer 105 is thinner than 5 nm, the anti-oxidation layer 105 might not be formed in part of the region because of in-plane thickness distribution attributed to a deposition apparatus. Further, in the case where the resistance of the anti-oxidation layer 105 is higher than that of the gate electrode 104, it is preferable that the thickness of the anti-oxidation layer 105 be less than or equal to 100 nm to suppress an increase in resistance.

As an example, titanium nitride may be deposited to a thickness of 30 nm by a sputtering method to form the anti-oxidation layer 105.

With the anti-oxidation layer 105, oxidation of the gate electrode 104 by oxygen detached from the insulating layer 106 heated by light irradiation treatment can be suppressed. To reduce the size of semiconductor devices, it is important to reduce the thickness of an insulating layer between a gate electrode and a semiconductor layer; however, a metal oxide film with high resistance formed by oxidation of the gate electrode leads to an increase in the thickness of the insulating layer in some cases, which adversely affects electrical characteristics. Hence, provision of the anti-oxidation layer 105 enables a highly reliable semiconductor device to be manufactured particularly in the case where the size of the semiconductor device is small.

Although the anti-oxidation layer 105 is formed in any embodiment described in this specification, the anti-oxidation layer 105 is not necessarily provided, which depends on the quality of a material of the gate electrode 104, a margin of thickness of the insulating layer between the gate electrode 104 and the oxide semiconductor layer 108, or the like.

Figure 2C:
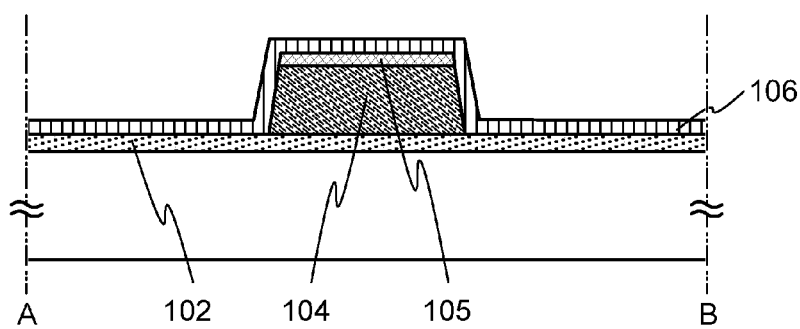

Next, the insulating layer 106 is formed over the base layer 102, the gate electrode 104, and the anti-oxidation layer 105 (see FIG. 2C). It is necessary to use a layer from which oxygen can be released by heating as the insulating layer 106. The expression "oxygen can be released by heating" means that the amount of released oxygen which is converted to oxygen atoms is greater than or equal to $1\times10^{18}$ atoms/cm$^3$ according to thermal desorption spectroscopy (TDS) by heating at a temperature lower than or equal to 300° C.

As the insulating layer 106, a single film or a stacked-layer film containing silicon oxide, aluminum oxide, hafnium oxide, hafnium silicate, hafnium aluminate, zirconium oxide, yttrium oxide, lanthanum oxide, or cerium oxide as its main component may be formed by a known method such as a CVD method such as a plasma-enhanced CVD method, a PVD method, or a sputtering method.

As a method for forming the insulating layer 106 from which oxygen can be released by heating, it is preferable to use a sputtering method capable of keeping the oxygen concentration in a deposition atmosphere high. For example, deposition is performed by a sputtering method using oxygen or a mixed gas of oxygen and a rare gas (e.g., argon) as a deposition gas, whereby the insulating layer 106 from which oxygen can be released by heating can be formed. In the case where a mixed gas of oxygen and a rare gas is used as a deposition gas, the proportion of oxygen is preferably set higher; it is preferable to set the proportion of oxygen to 6% or more and less than 100% of the deposition gas. Accordingly, the insulating layer 106 can be formed to contain a sufficient amount of oxygen, so that oxygen vacancies or interface states in the oxide semiconductor layer 108 in a region which overlaps with the gate electrode 104 can be more effectively reduced by light irradiation treatment to heat the insulating layer 106.

The expression "contain a sufficient amount of oxygen" means that the amount of released oxygen which is converted to oxygen atoms is greater than or equal to $1\times10^{19}$ atoms/cm$^3$, preferably greater than or equal to $3\times10^{20}$ atoms/cm$^3$ according to thermal desorption spectroscopy (TDS) by heating at a temperature lower than or equal to 300° C.

The insulating layer 106 from which oxygen can be released by heating can also be formed by a sputtering method using oxygen-excess silicon oxide (SiO$_X$ (X>2)) as a target. In the oxygen-excess silicon oxide (SiO$_x$ (X>2)), the number of oxygen atoms per unit volume is greater than twice the number of silicon atoms per unit volume. The number of silicon atoms and the number of oxygen atoms per unit volume are measured by Rutherford backscattering spectrometry. In the case where such a target material is used, the oxygen concentration in the deposition gas is not limited to the above-described one.

The thickness of the insulating layer 106 is preferably greater than or equal to 0.1 nm and less than or equal to 500 nm, for example. When the thickness of the insulating layer 106 is thinner than 0.1 nm, it is difficult to keep insulation between the gate electrode 104 and the oxide semiconductor layer 108 by the insulating layer 106. As the thickness of the insulating layer 106 is larger, a short channel effect increases and the threshold voltage tends to shift more in the negative direction.

Since the insulating layer 106 from which oxygen can be released by heating is provided, heating of the gate electrode 104 by light irradiation treatment is accompanied by heating of the insulating layer 106 in a region which overlaps with the gate electrode 104, so that oxygen is released therefrom. Consequently, oxygen vacancies or interface states in the oxide semiconductor layer 108 in the region which overlaps with the gate electrode 104 can be reduced. Accordingly, a highly reliable semiconductor device with less change in threshold voltage can be manufactured.

As an example, a mixed gas of oxygen and argon may be introduced into a deposition atmosphere, and silicon oxide may be deposited to a thickness of 30 nm by a sputtering method while keeping the oxygen concentration in the gas at 6% or more from the insulating layer 106. Such a layer formed by a sputtering method is preferable because the amount of hydrogen, nitrogen, and the like is less.

Figure 2D:
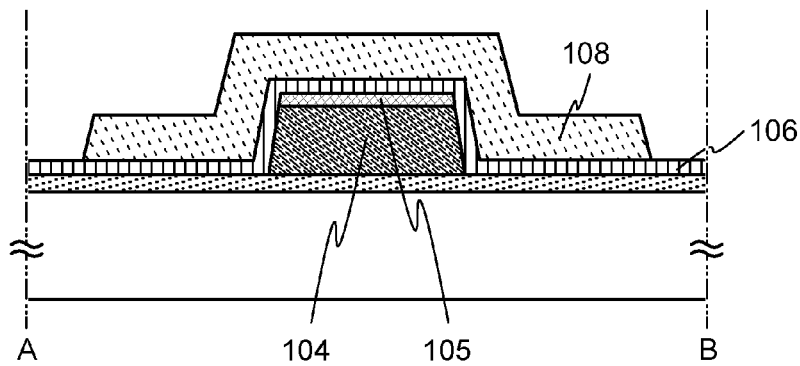

Next, the oxide semiconductor layer 108 is formed in contact with the insulating layer 106 (see FIG. 2D). The oxide semiconductor layer 108 can be formed as follows: a layer for the oxide semiconductor layer 108 is formed over the insulating layer 106 and is partly removed by a known method such as a dry etching method or a wet etching method using a photoresist mask.

As the layer for the oxide semiconductor layer 108, for example, a layer containing at least one selected from In, Ga, Sn, and Zn formed by a sputtering method or the like may be used. For example, an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor layer, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; or an oxide of one metal element, such as an In—O-based oxide semiconductor, a Sn—O-based oxide semiconductor, or a Zn—O-based oxide semiconductor can be used. In addition, any of the above oxide semiconductors may further contain an element other than In, Ga, Sn, and Zn, for example, SiO$_2$.

For example, the In—Ga—Zn—O-based oxide semiconductor means an oxide semiconductor containing indium (In), gallium (Ga), and zinc (Zn), and there is no limitation on the composition ratio thereof.

As an example, in the case where an In—Zn—O-based layer is formed as the oxide semiconductor layer 108, a target has a composition ratio of In:Zn=50:1 to 1:2 in an atomic ratio (In$_2$O$_3$:ZnO=25:1 to 1:4 in a molar ratio), preferably In:Zn=20:1 to 1:1 in an atomic ratio (In$_2$O$_3$:ZnO=10:1 to 1:2 in a molar ratio), further preferably In:Zn=15:1 to 1.5:1 in an atomic ratio (In$_2$O$_3$:ZnO=15:2 to 3:4 in a molar ratio). For example, in a target used for formation of an In—Zn—O-based oxide semiconductor, the composition ratio is set that Z>1.5X+Y where an atomic ratio of In:Zn:O=X:Y:Z.

As the layer for the oxide semiconductor layer 108, a thin film expressed by a chemical formula, $InMO_3(ZnO)_m$ (m>0), can also be used. Here, M represents one or more metal elements selected from Zn, Ga, Al, Mn, and Co. For example, Ga, Ga and Al, Ga and Mn, Ga and Co, or the like can be used as M.

As a target used for formation of the layer for the oxide semiconductor layer 108, for example, a target of metal oxide having a composition ratio of $In_2O_3$:$Ga_2O_3$:ZnO=1:1:1 (in a molar ratio) or a composition ratio of $In_2O_3$:$Ga_2O_3$:ZnO=1:1:2 (in a molar ratio) may be used.

As for the target of metal oxide used for formation of the layer for the oxide semiconductor layer 108, the relative density of an oxide semiconductor in the target is set to preferably 80% or more, further preferably 95% or more, still further preferably 99.9% or more. With the use of such an oxide semiconductor target with high relative density, the oxide semiconductor layer 108 can be formed densely.

As a sputtering gas, a rare gas (typically, argon), oxygen, or a mixed gas of a rare gas and oxygen can be used. It is preferable to use a high-purity gas in which impurities such as hydrogen, water, hydroxyl, or hydride are reduced to a concentration in the order of ppm (further preferably, in the order of ppb).

As the sputtering gas used for formation of the layer for the oxide semiconductor layer 108, for example, oxygen may be supplied at a flow rate of 40 sccm (the proportion of the oxygen flow is 100%) to a sputtering apparatus.

At the time of forming the layer for the oxide semiconductor layer 108, for example, the substrate is held in a process chamber that is maintained at reduced pressure, and the substrate is heated to a temperature higher than or equal to 100° C. and lower than or equal to 600° C., preferably higher than or equal to 200° C. and lower than or equal to 400° C. Further, a high-purity gas from which impurities such as hydrogen, water, a hydroxyl group, and hydride are removed is introduced while moisture remaining in the process chamber is removed, whereby the layer is deposited using the above-described target of metal oxide. Impurities contained in the layer can be reduced by heating the substrate at the time of deposition. In addition, damage on the layer due to sputtering is suppressed. That substrate heat treatment needs to be performed at temperatures lower than or equal to either upper temperature limit of the gate electrode 104 and the anti-oxidation layer 105.

Before the deposition of the layer for the oxide semiconductor layer 108, it is preferable to perform preheat treatment in order to remove moisture and the like remaining in the sputtering apparatus. For the preheat treatment, a method in which the inside of the process chamber is heated to higher than or equal to 200° C. and lower than or equal to 600° C. under reduced pressure, a method in which introduction and exhaust of nitrogen or an inert gas are repeated while the inside of the process chamber is heated, and the like can be given. After the preheat treatment, the substrate or the sputtering apparatus is cooled, which is followed by film deposition without exposure to the air. In that case, not water but oil or the like is preferably used as a coolant for the target. Although a certain level of effect can be provided by introduction and exhaust of nitrogen repeated without heating, it is further preferable to perform the treatment with the inside of the process chamber heated.

For removing moisture and the like remaining in the sputtering apparatus before, during, or after the film deposition, an entrapment vacuum pump is preferably used for a vacuum pump provided for the process chamber. For example, a cryopump, an ion pump, a titanium sublimation pump, or the like may be used. A turbo pump provided with a cold trap may be used. Since hydrogen, water, and the like can be removed from the process chamber with any of the above pumps, the oxide semiconductor layer 108 can be formed with less impurity concentration.

The conditions for depositing the layer for the oxide semiconductor layer 108 can be set as follows: the distance between the substrate and the target is 170 mm, the pressure is 0.4 Pa, the direct current (DC) power is 0.5 kW, and the atmosphere is an oxygen atmosphere (the proportion of the oxygen flow is 100%). The pulse direct current (DC) power is preferably used because particles can be reduced and the film thickness can be uniform. An appropriate thickness of the layer differs depending on the oxide semiconductor material to be used, the usage, or the like; thus, the thickness thereof may be determined as appropriate in accordance with the material, the usage, or the like.

The thickness of the layer for the oxide semiconductor layer 108 is preferably greater than or equal to 3 nm and less than or equal to 50 nm. This is because when the oxide semiconductor layer 108 is too thick (e.g., 100 nm or more), there is a possibility that the short channel effect has a large influence to make a small transistor normally on. Here, "normally on" means a state where a channel formation region exists without voltage application to the gate electrode so that current flows through the transistor.

The oxide semiconductor layer 108 can be formed as follows: the layer for the oxide semiconductor layer 108 formed through the above step is partly removed by a known method such as a dry etching method or a wet etching method using a photoresist mask. An example of an etching gas which can be used for the dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). A gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may also be used.

Examples of an etchant that can be used for the wet etching are a mixed solution of phosphoric acid, acetic acid, and nitric acid; and an ammonia peroxide mixture (hydrogen peroxide solution of 31 wt %:ammonia solution of 28 wt %:water=5:2:2). An etchant such as ITO-07N (produced by KANTO CHEMICAL CO., INC.) may also be used.

Figure 3A:
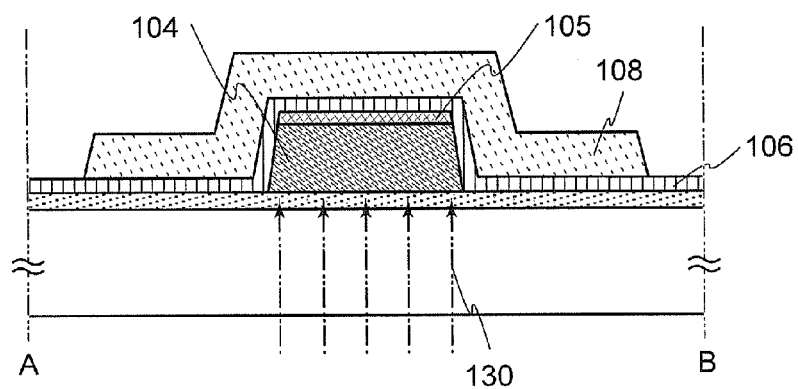
FIGS. 3A to 3C illustrate a method for manufacturing the semiconductor device described in Embodiment 1.
Figure 3B:
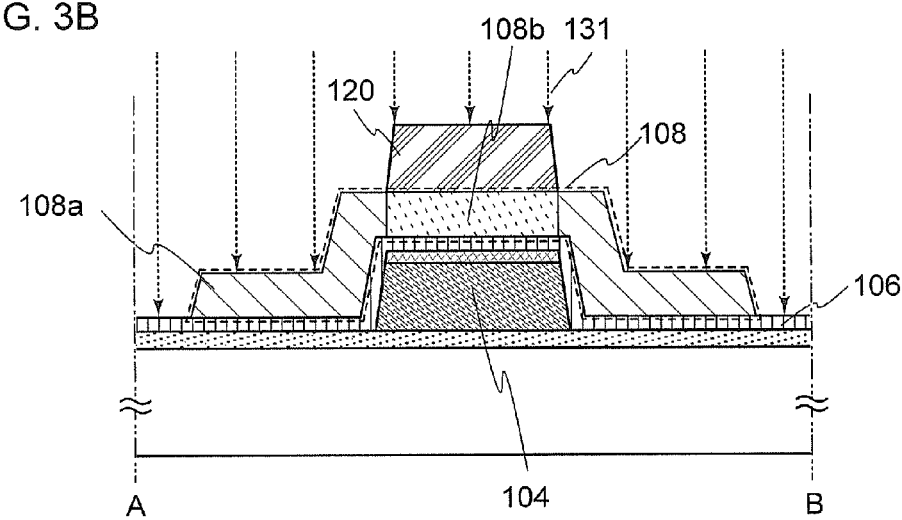

Next, light irradiation treatment 130 is performed on the gate electrode 104 (see FIG. 3A). That light is absorbed in the gate electrode 104 to heat the gate electrode 104. The insulating layer 106 in the region which overlaps with the gate electrode 104 is accordingly heated to release oxygen contained in the insulating layer 106. Part of released oxygen is added into the oxide semiconductor layer 108 especially in the region which overlaps with the gate electrode 104. Although the light irradiation treatment 130 is performed on the gate electrode 104 in this embodiment, the light irradiation treatment 130 may be performed on the entire surface of the substrate. Further, although the light irradiation treatment 130 is performed from the bottom surface side as shown in FIG. 3A in this embodiment, one embodiment of the present invention is not limited thereto; the light irradiation treatment 130 may be performed from the top surface side (i.e., the oxide semiconductor layer 108 side in FIG. 3A) or from both surface sides. As for a method for heating the gate electrode 104, the gate electrode 104 may be formed using a magnetic metal and irradiated with an electromagnetic wave such as a microwave, so that the gate electrode 104 can be heated by induction heating. As for the magnetic metal, for example, a layer formed of at least one of metal films and alloy films containing iron (Fe), cobalt (Co), nickel (Ni), gadolinium (Gd), terbium (Tb), dysprosium (Dy), holmium (Ho), erbium (Er), thulium (Tm), vanadium (V), chromium (Cr), manganese (Mn), copper (Cu), zinc (Zn), palladium (Pd), or platinum (Pt) as a main component may be used.

The ion binding property of the oxide semiconductor layer 108 is high, and thus owing to the out-compensation effect, oxygen vacancies are likely to be generated. Some of oxygen vacancies form donors to generate electrons that are carriers. Therefore, oxygen vacancies in the vicinity of the interface with the insulating layer 106 in the region of the oxide semiconductor layer 108 which overlaps with the gate electrode 104 shifts the threshold voltage of the transistor in the negative direction (i.e., makes the transistor a so-called normally-on transistor).

In view of the foregoing, the above-described light irradiation treatment 130 is performed to add oxygen into the oxide semiconductor layer 108 in the region which overlaps with the gate electrode 104, so that the number of oxygen vacancies in that region can be reduced, thereby suppressing the shift of the threshold voltage in the negative direction.

In addition, such a reduction in oxygen vacancies or interface states in the oxide semiconductor layer 108 in the region which overlaps with the gate electrode 104 by the above-described light irradiation treatment 130 enables trapping of electrical charges caused by operation of the semiconductor device in the interface between the insulating layer 106 and the channel formation region to be sufficiently suppressed.

Further, against a concern about an increase in the thickness of the insulating layer by surface oxidation of the gate electrode 104 due to oxygen released on the gate electrode 104 side from the insulating layer 106, the anti-oxidation layer 105 is formed in this embodiment to suppress the surface oxidation of the gate electrode 104.

The anti-oxidation layer 105 is formed on the top surface of the gate electrode 104 as shown in FIG. 3A in this embodiment; however, one embodiment of the present invention is not limited thereto. For example, the anti-oxidation layer 105 may be formed not only on the top surface of the gate electrode 104 but also on the side surface of the gate electrode 104.

The light irradiation treatment 130 can be performed with a laser apparatus, for example. As the laser, one or more of the following can be used: a gas laser such as an Ar laser, a Kr laser, or an excimer laser; a laser of which medium is single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ that is doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. Further, a solid state laser a laser medium of which is solid provides an advantage of a long period of maintenance free and an advantage of a relatively stable output.

Alternatively, instead of the laser apparatus, a discharge lamp typified by a flash lamp (e.g., a xenon flash lamp and a krypton flash lamp), a xenon lamp, or a metal halide lamp; or an exothermic lamp typified by a halogen lamp or a tungsten lamp can be used. The flash lamp repeats emission with extremely high intensity in a short time (longer than or equal to 0.1 msec and shorter than or equal to 10 msec) and can irradiate a large area; thus, efficient heating is possible regardless of the area of the substrate 100. Further, the flash lamp can control heating of the gate electrode 104 by change in the interval of emission time. Moreover, since the life of the flash lamp is long and stand-by power consumption thereof is low, running cost can be suppressed.

As one example, as the light irradiation treatment 130, the gate electrode 104 may be heated with a xenon flash lamp with an emission time of 1 msec.

Next, a mask 120 is formed on the region of the oxide semiconductor layer 108 which overlaps with the gate electrode 104, and then impurity addition treatment 131 is performed on the oxide semiconductor layer 108. In this manner, in the oxide semiconductor layer 108, an impurity is added into a region on which the mask 120 is not positioned, so that the low resistance region 108a which functions as the source region (or the drain region) and the channel formation region 108b are formed in a self-aligned manner (see FIG. 3B). The mask 120 may be removed after the low resistance region is formed.

The mask 120 can be formed as follows, for example: a known resist material is provided on the oxide semiconductor layer 108 and is subjected to light exposure with the use of a photomask, and then removed as appropriate by a known method such as a dry-etching method or a wet-etching method. There is no particular limitation on the thickness of the mask 120; for example, it is preferable that the thickness of the mask 120 be greater than or equal to 0.3 μm and less than or equal to 5 μm. When the thickness of the mask 120 is less than 0.3 μm, the impurity may pass through the mask 120 to the semiconductor layer 108 at the time of the impurity addition treatment 131. On the other hand, a thicker thickness than 5 μm is not preferable in terms of a deposition rate thereof and a manufacturing cost.

The impurity addition treatment 131 can be performed using, for example, one or more selected from a rare gas such as argon (Ar), krypton (Kr), or xenon (Xe), and the elements belonging to the 15$^{th}$ Group of the periodic table such as nitrogen (N), phosphorus (P), arsenic (As), and antimony (Sb) with an ion-doping apparatus or an ion implantation apparatus. A typical example of the ion-doping apparatus is a non-mass-separation type apparatus in which plasma excitation of a process gas is performed and an object to be processed is irradiated with all kinds of ion species generated. In this apparatus, the object is irradiated with ion species of plasma without mass separation. In contrast, the ion implantation apparatus is a mass-separation apparatus. In the ion implantation apparatus, mass separation of ion species of plasma is performed and an object to be processed is irradiated with ion species having predetermined masses.

For example, as the impurity addition treatment 131, a region including a portion where the oxide semiconductor layer 108 may be irradiated with an argon (Ar) gas with an ion doping apparatus. In the case of using argon as a source gas, the low resistance region 108a which functions as the source region (or the drain region) may be formed by performing irradiation with acceleration voltage in the range from 0.1 kV to 100 kV and the dose in the range from $1\times10^{14}$ ions/cm$^2$ to $1\times10^{17}$ ions/cm$^2$. The resistivity of the low resistance region 108a is preferably greater than or equal to $1\times10^{-4}$ Ω·cm and less than or equal to 3 Ω·cm, further preferably greater than or equal to $1\times10^{-3}$ Ω·cm and less than or equal to $3\times10^{-1}$ Ω·cm. Accordingly, a reduction in the on-state current can be suppressed to increase the on/off ratio. Since argon is an inert gas, a gas atmosphere and temperatures during ion addition are easily controlled; thus, work efficiency and safety can be improved.

The gate electrode 104 is entirely heated by the above-described light irradiation treatment 130; therefore, oxygen is released also from the insulating layer 106 on the side portion of the gate electrode 104 in the bottom-gate semiconductor device described in this embodiment, and may be added into the low resistance region 108a of the oxide semiconductor layer 108 to increase the resistance thereof. However, since the impurity addition treatment 131 is also performed on those regions to sufficiently reduce the resistance, an adverse effect on the electrical characteristics (e.g., reduction in the on-state current due to high resistance of the low resistance region 108a) can be prevented.

The impurity addition treatment 131, which is performed on the oxide semiconductor layer 108 in this embodiment, is not necessarily performed. The impurity addition treatment 131 can be skipped as long as ohmic contact can be formed by electrical connection between the oxide semiconductor layer 108 and the source electrode 114a and between the oxide semiconductor layer 108 and the drain electrode 114b.

Figure 3C:
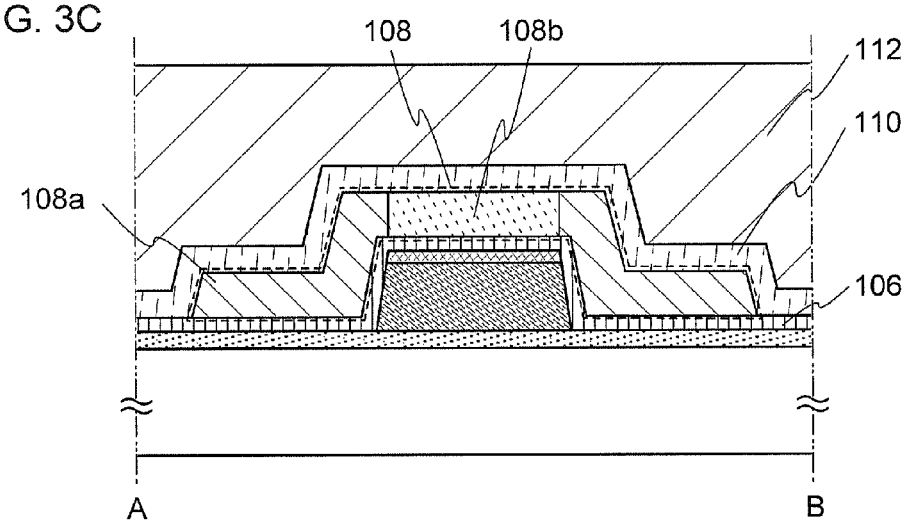

Next, over the insulating layer 106 and the oxide semiconductor layer 108, the first interlayer insulating layer 110 and the second interlayer insulating layer 112 are formed (see FIG. 3C).

The first interlayer insulating layer 110 may be formed of, for example, a single layer or a stacked layer of an insulating film of silicon oxide, silicon nitride, silicon oxynitride, silicon nitride oxide, aluminum oxide, aluminum nitride, aluminum oxynitride, aluminum nitride oxide, or the like by a CVD method such as a plasma-enhanced CVD method, a PVD method, a sputtering method, or the like.

The second interlayer insulating layer 112 may be formed of, for example, an organic insulating material such as polyimide, acrylic, polyamide, or polyimide-amide, or a siloxane resin by a coating method such as a spin-coating method or a dispenser method, a printing method such as a screen printing method, or the like. The siloxane resin corresponds to a resin that contains a Si—O—Si bond. Siloxane includes a skeleton formed from a bond of silicon (Si) and oxygen (O). An organic group (such as an alkyl group and an aryl group) or a fluoro group may be used as a substituent thereof.

The second interlayer insulating layer 112 is a layer for planarizing unevenness of a top surface of the first interlayer insulating layer 110; accordingly, electrodes, wirings, or the like can be formed appropriately on the transistor 150.

The second interlayer insulating layer 112 is not necessarily provided, which depends on the surface unevenness after formation of the first interlayer insulating layer 110. Although the first interlayer insulating layer 110 and the second interlayer insulating layer 112 each have a single-layer structure in this embodiment, a stacked-layer structure of two or more layers may be employed as well.

As one example, aluminum oxide may be deposited to a thickness of 300 nm by a plasma-enhanced CVD method to form the first interlayer insulating layer, and then, polyimide may be deposited to a thickness of 1.5 μm by a spin-coating method and cured by heat treatment to form the second interlayer insulating layer 112.

Figure 4:
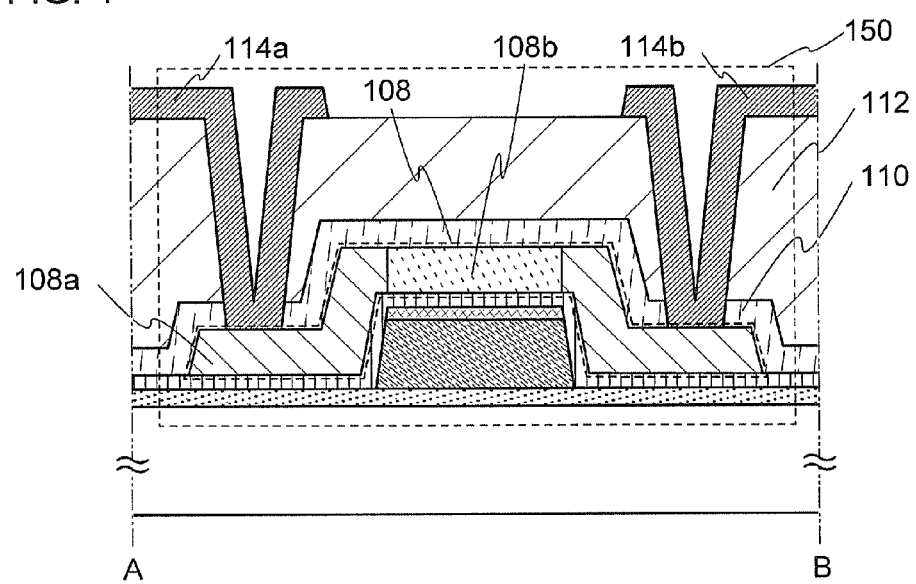
FIG. 4 illustrates a method for manufacturing the semiconductor device described in Embodiment 1.

Next, openings are formed in the first interlayer insulating layer 110 and the second interlayer insulating layer 112, and then, the source electrode 114a which is electrically connected to the low resistance region 108a through the opening and the drain electrode 114b which is electrically connected to the low resistance region 108a through the opening are formed (FIG. 4).

The openings in the first interlayer insulating layer 110 and the second interlayer insulating layer 112 may be formed by selectively removing the first interlayer insulating layer 110 and the second interlayer insulating layer 112 by a known method such as a dry-etching method or a wet-etching method using a photoresist mask.

The source electrode 114a and the drain electrode 114b can be formed as follows: a conductive layer is formed by a sputtering method, an evaporation method, or the like and etched into a desired shape by a known method such as a dry-etching method or a wet-etching method using a photoresist mask. The source electrode 114a and the drain electrode 114b can also be formed by forming a conductive layer in appropriate portions by a droplet discharging method, a printing method, an electrolytic plating method, or the like. Alternatively, a reflow method or a damascene method may be used. The conductive layer forming the source electrode 114a and the drain electrode 114b is formed using a metal such as aluminum (Al), gold (Au), copper (Cu), tungsten (W), tantalum (Ta), molybdenum (Mo), titanium (Ti), or chromium (Cr), Si, Ge, an alloy thereof, or a nitride thereof. A stacked-layer structure of such materials may also be used.

As one example, 50-nm-thick titanium, 500-nm-thick aluminum, and 50-nm-thick titanium are staked by a sputtering method and are patterned by a dry-etching method using a photoresist mask to form the source electrode 114a and the drain electrode 114b.

Through the above-described process, the semiconductor device that is the bottom-gate transistor 150 as shown in FIG. 1B can be manufactured, which includes the base layer 102 formed over the substrate 100, the gate electrode 104 formed over the base layer 102, the anti-oxidation layer 105 formed over the gate electrode 104, the insulating layer 106 formed over the base layer 102, the gate electrode 104, and the anti-oxidation layer 105, the oxide semiconductor layer 108 which includes the low resistance region 108a functioning as the source region (or the drain region) and the channel formation region 108b and is formed over the insulating layer 106, the first interlayer insulating layer 110 formed over the insulating layer 106 and the oxide semiconductor layer 108, the second interlayer insulating layer 112 formed over the first interlayer insulating layer 110, and the source electrode 114a and the drain electrode 114b which are electrically connected to the low resistance region 108a through the openings in the first interlayer insulating layer 110 and the second interlayer insulating layer 112.

Although not shown, the gate electrode 104 is electrically led over the second interlayer insulating layer 112 through a conductive wiring via a contact hole which is formed in the first interlayer insulating layer 110 and the second interlayer insulating layer 112.

In the oxide semiconductor layer 108, the carrier concentration is sufficiently low (e.g., less than $1\times10^{12}/cm^3$, preferably less than $1.45\times10^{10}/cm^3$) as compared with the carrier concentration (about $1\times10^{14}/cm^3$) of a general silicon wafer. At a drain voltage in the range of from 1 V to 10 V, the off-state current (current flowing between the source and the drain when the gate-source voltage is 0 V or less) is $1\times10^{-13}$ A or less or the off-state current density (a value obtained by dividing an off-state current by a channel width of a transistor) is 10 aA/μm ("a" represents "atto" and denotes a factor of $10^{-18}$) or less, preferably 1 aA/μm or less, and further preferably 100 zA/μm ("z" represents "zepto" and denotes a factor of $10^{-21}$) or less, in the case where channel length is 10 μm and the total thickness of the oxide semiconductor layer is 30 nm. The resistance at the time when the transistor is off (off-state resistance R) can be calculated according to Ohm's law using the values of the off-state current and the drain voltage, and the off-state resistivity ρ can be calculated according to the formula ρ=RA/L (R is the off-state resistance) using the cross-sectional area A of the channel formation region and the channel length L. The off-state resistivity is preferably $1\times10^9$ Ω·m or higher (or $1\times10^{10}$ Ω·m or higher). The cross-section area A can be obtained according to the formula A=dW (d: the thickness of the channel formation region, W: the channel width).

The off-state current of a transistor including amorphous silicon is about $10^{-12}$ A, whereas the off-state current of a transistor including an oxide semiconductor is 1/10000 or less of that of the transistor including amorphous silicon. Thus, the transistor 150 whose off-state current characteristics are extremely excellent can be provided.

<Effect of Semiconductor Device Manufactured According to this Embodiment>

In the transistor 150 shown in FIGS. 1A and 1B, which is manufactured through the above-described process, not only the gate electrode 104 but also the insulating layer 106 in the region which overlaps with the gate electrode 104 is heated by the light irradiation treatment, so that oxygen contained in the insulating layer is released. That oxygen released from the insulating layer 106 can be added into the oxide semiconductor layer 108, which is in contact with the insulating layer 106, in the region which overlaps with the gate electrode 104. Accordingly, oxygen vacancies or interface states in the oxide semiconductor layer 108 in the region which overlaps with the gate electrode 104 can be reduced.

In this manner, according to the method described in this embodiment, a highly reliable semiconductor device with less change in the threshold voltage can be manufactured.

[Embodiment 2]

In Embodiment 2, a semiconductor device whose structure is different from Embodiment 1 is described using FIGS. 5A and 5B, FIGS. 6A to 6C, and FIGS. 7A and 7B. In the structure of this embodiment described below, portions which are the same as or have functions similar to those (functions) in Embodiment 1 are denoted by the same reference numerals in the drawings, and the description thereof is not repeated.

<Structure of Semiconductor Device According to this Embodiment>

Figure 5A:
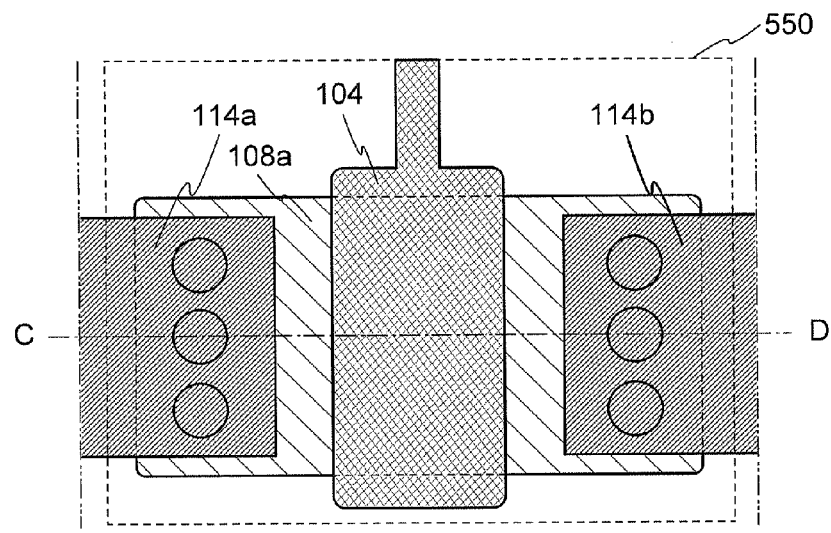
FIGS. 5A and 5B illustrate a structure of a semiconductor device described in Embodiment 2.
Figure 5B:
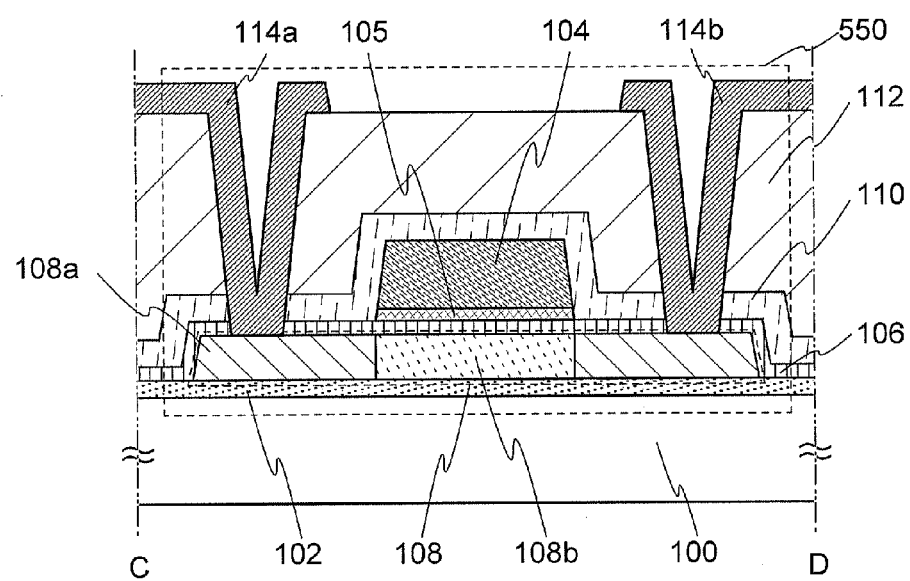

FIGS. 5A and 5B illustrate an example of a structure of a semiconductor device manufactured according to a method of this embodiment, a top-gate transistor 550: FIG. 5A is a top view of the transistor 550 and FIG. 5B is a cross-sectional schematic diagram taken along a dashed line C-D in FIG. 5A. In the top view of FIG. 5A, only patterned film(s) and/or layer(s) are shown for easy understanding of the structure. Although the manufacturing method is described on the case where the transistor 550 is an n-channel transistor whose carriers are electrons in this embodiment, one embodiment of the present invention is not limited to the case of an n-channel transistor.

The transistor 550 shown in FIGS. 5A and 5B includes a substrate 100, a base layer 102 formed over the substrate 100, an oxide semiconductor layer 108 which includes a low resistance region 108a functioning as a source region (or a drain region) and a channel formation region 108b and is formed over the base layer 102, an insulating layer 106 formed over the oxide semiconductor layer 108, an anti-oxidation layer 105 and a gate electrode 104 which are formed over the insulating layer 106, a first interlayer insulating layer 110 formed over the insulating layer 106, the anti-oxidation layer 105, and the gate electrode 104, a second interlayer insulating layer 112 formed over the first interlayer insulating layer 110, and a source electrode 114a and a drain electrode 114b which are electrically connected to the low resistance region 108a through openings in the first interlayer insulating layer 110, the second interlayer insulating layer 112, and the insulating layer 106.

<Manufacturing Method of Semiconductor Device According to this Embodiment>

A method for manufacturing the transistor 550 is described below using FIGS. 6A to 6C and FIGS. 7A and 7B.

Figure 6A:
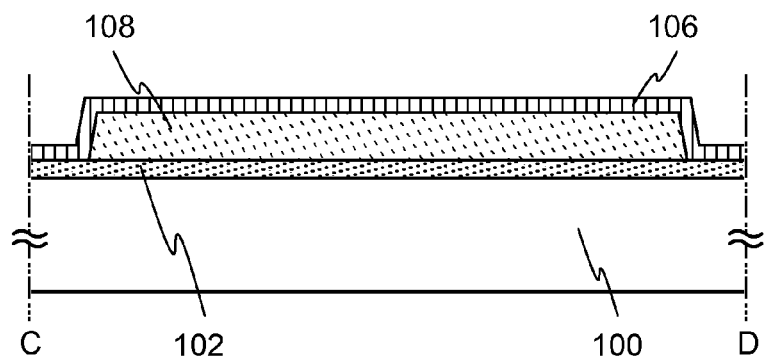
FIGS. 6A to 6C illustrate a method for manufacturing the semiconductor device described in Embodiment 2.

First, the base layer 102 is formed over the substrate 100, the oxide semiconductor layer 108 is formed over the base layer 102, and the insulating layer 106 from which oxygen can be released by heating is formed over the base layer 102 and the oxide semiconductor layer 108 (see FIG. 6A). Material qualities, characteristics, formation methods, and the like of the substrate 100, the base layer 102, the insulating layer 106, and the oxide semiconductor layer 108 are the same as those in Embodiment 1, and thus detailed description thereof is not repeated here.

Figure 6B:
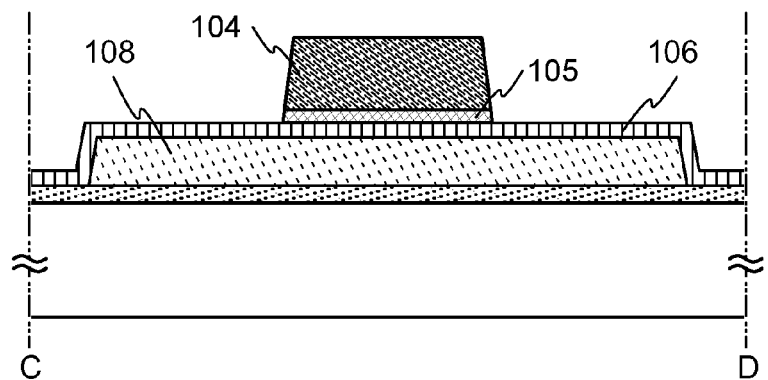

Next, the anti-oxidation layer 105 and the gate electrode 104 are formed over the insulating layer 106 (see FIG. 6B). Material qualities, characteristics, formation methods, and the like of the anti-oxidation layer 105 and the gate electrode 104 are the same as those in Embodiment 1, and thus detailed description thereof is not repeated here.

Figure 6C:
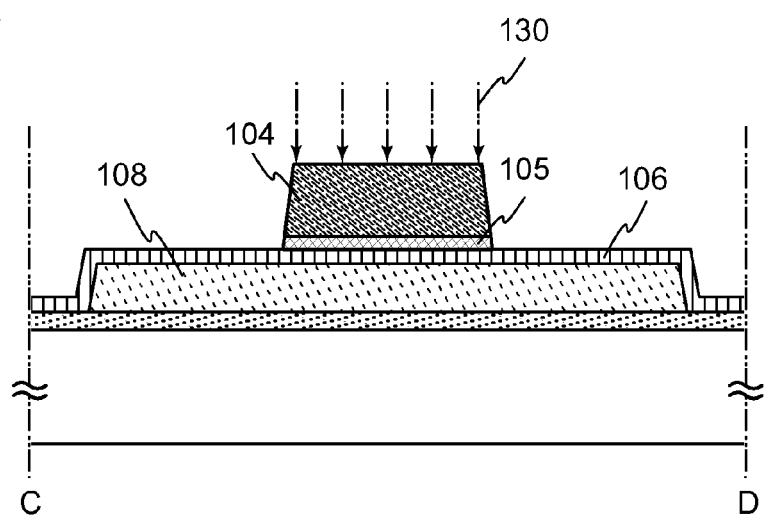

Next, light irradiation treatment 130 is performed on the gate electrode 104 (see FIG. 6C). Accordingly, oxygen is added into the oxide semiconductor layer 108 in the region which overlaps with the gate electrode 104, like in Embodiment 1. Although the light irradiation treatment 130 is performed on the gate electrode 104 in this embodiment, the light irradiation treatment 130 may be performed on the entire surface of the substrate. Further, although the light irradiation treatment 130 is performed from the top surface side as shown in FIG. 6C in this embodiment, one embodiment of the present invention is not limited thereto; the light irradiation treatment 130 may be performed from the bottom surface side (i.e., the substrate 100 side in FIG. 6C) or from both surface sides. An apparatus, a method, and the like of the light irradiation treatment 130 are the same as those in Embodiment 1, and thus detailed description thereof is not repeated here.

Figure 7A:
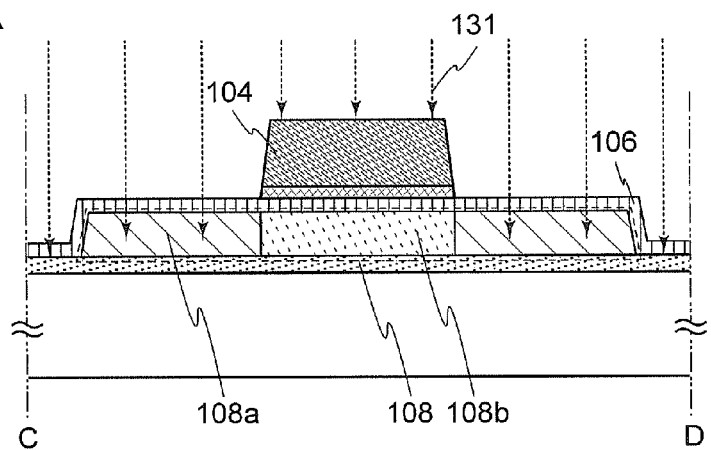
FIGS. 7A and 7B illustrate a method for manufacturing the semiconductor device described in Embodiment 2.

Next, impurity addition treatment 131 is performed on a region including the oxide semiconductor layer 108, so that the low resistance region 108a which functions as the source region (or the drain region) and the channel formation region 108b are formed (see FIG. 7A). An apparatus, a method, and the like of the impurity addition treatment 131 are the same as those in Embodiment 1, and thus detailed description thereof is not repeated here.

In this embodiment, since the gate electrode 104, which is formed over the oxide semiconductor layer 108, can be used as a mask for the impurity addition treatment 131, impurities can be prevented from being added into the oxide semiconductor layer 108 in a region which overlaps with the gate electrode 104, whereby the low resistance region 108a which functions as the source region (or the drain region) and the channel formation region 108b can be formed in a self-aligned manner (see FIG. 7A). Accordingly, the manufacturing process can be simplified. Consequently, a semiconductor device can be manufactured at lower cost.

Figure 7B:
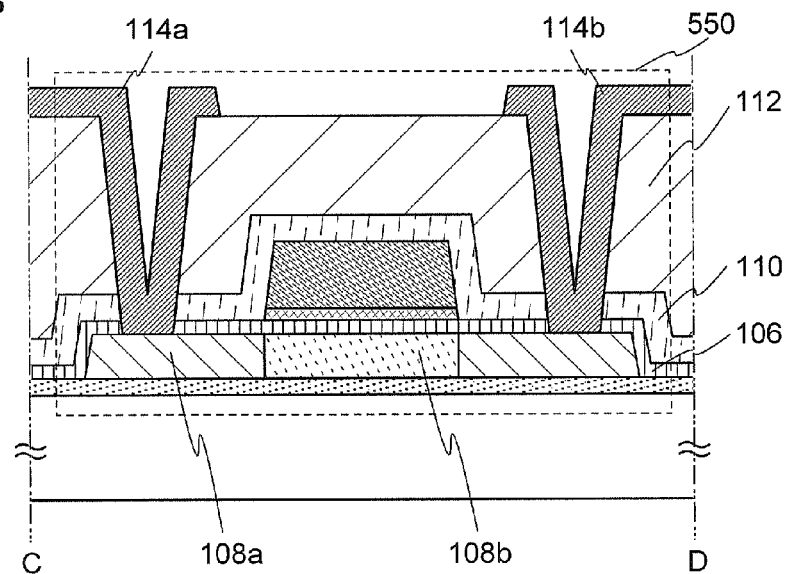

Next, over the gate electrode 104, the anti-oxidation layer 105, and the insulating layer 106, the first interlayer insulating layer 110 and the second interlayer insulating layer 112 are formed (see FIG. 7B). Material qualities, characteristics, formation methods, and the like of the first interlayer insulating layer 110 and the second interlayer insulating layer 112 are the same as those in Embodiment 1, and thus detailed description thereof is not repeated here.

The first interlayer insulating layer 110, which is formed over the insulating layer 106, the anti-oxidation layer 105, and the gate electrode 104 in this embodiment, is not necessarily provided. Further, although the first interlayer insulating layer 110 and the second interlayer insulating layer 112 each have a single-layer structure in this embodiment, a stacked-layer structure of two or more layers may be employed as well. A material quality and a structure of an interlayer insulating layer may be selected as appropriate considering the use application or requisite characteristics of the transistor 550.

Through the above-described process, the semiconductor device that is the top-gate transistor 550 as shown in FIG. 5B can be manufactured, which includes the base layer 102 formed over the substrate 100, the oxide semiconductor layer 108 which includes the low resistance region 108a functioning as the source region (or the drain region) and the channel formation region 108b and is formed over the base layer 102, the insulating layer 106 formed over the base layer 102 and the oxide semiconductor layer 108, the anti-oxidation layer 105 and the gate electrode 104 which are formed over the insulating layer 106, the first interlayer insulating layer 110 formed over the insulating layer 106, the oxide anti-oxidation layer 105, and the gate electrode 104, the second interlayer insulating layer 112 formed over the first interlayer insulating layer 110, and the source electrode 114a and the drain electrode 114b which are electrically connected to the low resistance region 108a through openings in the first interlayer insulating layer 110, the second interlayer insulating layer 112, and the insulating layer 106.

Although not shown, the gate electrode 104 is electrically led over the second interlayer insulating layer 112 through a conductive wiring via a contact hole which is formed in the first interlayer insulating layer 110 and the second interlayer insulating layer 112.

<Effect of Semiconductor Device Manufactured According to this Embodiment>

In the transistor 550 shown in FIGS. 5A and 5B, which is manufactured through the above-described process, not only the gate electrode 104 but also the insulating layer 106 in the region which overlaps with the gate electrode 104 is heated by the light irradiation treatment 130, so that oxygen contained in the insulating layer is released. That oxygen released from the insulating layer 106 can be added into the oxide semiconductor layer 108, which is in contact with the insulating layer 106, in the region which overlaps with the gate electrode 104. Accordingly, oxygen vacancies or interface states in the oxide semiconductor layer 108 in the region which overlaps with the gate electrode 104 can be reduced.

In this manner, according to the method described in this embodiment, a highly reliable semiconductor device with less change in the threshold voltage can be manufactured.

Further, the gate electrode 104 can also be used as a mask for the impurity addition treatment 131 to form the low resistance region 108a and the channel formation region 108b in the oxide semiconductor layer 108 in a self-aligned manner, in addition to the function for heating of the insulating layer 106. Accordingly, the manufacturing process of a semiconductor device can be simplified.

Accordingly, according to the method described in this embodiment, a highly reliable semiconductor device with less change in the threshold voltage can be manufactured at lower cost.

[Embodiment 3]

In Embodiment 3, a semiconductor device whose structure is different from Embodiment 1 is described using FIGS. 8A and 8B, FIGS. 9A to 9C, and FIGS. 10A and 10B. In the structure of this embodiment described below, portions which are the same as or have functions similar to those (functions) in Embodiment 1 are denoted by the same reference numerals in the drawings, and the description thereof is not repeated.

<Structure of Semiconductor Device According to this Embodiment>

Figure 8A:
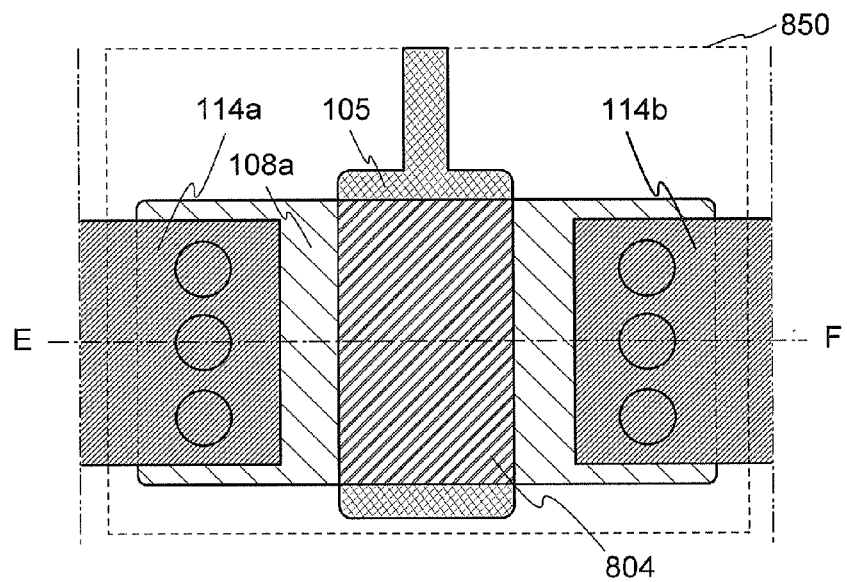
FIGS. 8A and 8B illustrate a structure of a semiconductor device described in Embodiment 3.
Figure 8B:
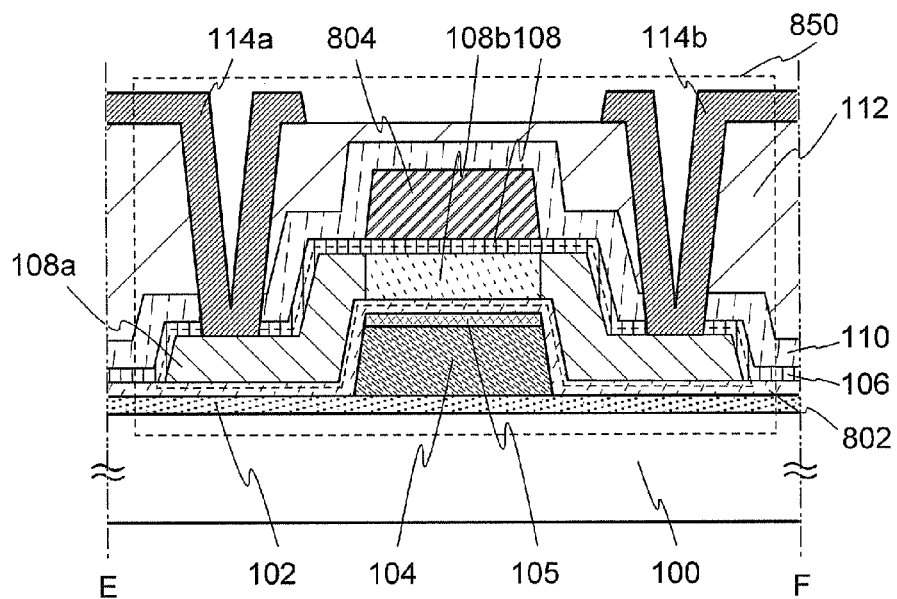

FIGS. 8A and 8B illustrate an example of a structure of a semiconductor device manufactured according to a method of this embodiment, a bottom-gate transistor 850: FIG. 8A is a top view of the transistor 850 and FIG. 8B is a cross-sectional schematic diagram taken along a dashed line E-F in FIG. 8A. In the top view of FIG. 8A, only patterned film(s) and/or layer(s) are shown for easy understanding of the structure. Although the manufacturing method is described on the case where the transistor 850 is an n-channel transistor whose carriers are electrons in this embodiment, one embodiment of the present invention is not limited to the case of an n-channel transistor.

The transistor 850 shown in FIGS. 8A and 8B includes a substrate 100, a base layer 102 formed over the substrate 100, a gate electrode 104 formed over the base layer 102, an anti-oxidation layer 105 formed over the gate electrode 104, a gate insulating layer 802 formed over the base layer 102, the gate electrode 104, and the anti-oxidation layer 105, an oxide semiconductor layer 108 which includes a low resistance region 108a functioning as a source region (or a drain region) and a channel formation region 108b and is formed over the gate insulating layer 802, an insulating layer 106 formed over the oxide semiconductor layer 108 and the gate insulating layer 802, a metal layer 804 formed over the insulating layer 106, a first interlayer insulating layer 110 formed over the insulating layer 106 and the metal layer 804, a second interlayer insulating layer 112 formed over the first interlayer insulating layer 110, and a source electrode 114a and a drain electrode 114b which are electrically connected to the low resistance region 108a through openings in the insulating layer 106, the first interlayer insulating layer 110 and the second interlayer insulating layer 112.

<Manufacturing Method of Semiconductor Device According to this Embodiment>

A method for manufacturing the transistor 850 is described below using FIGS. 9A to 9C and FIGS. 10A and 10B.

Figure 9A:
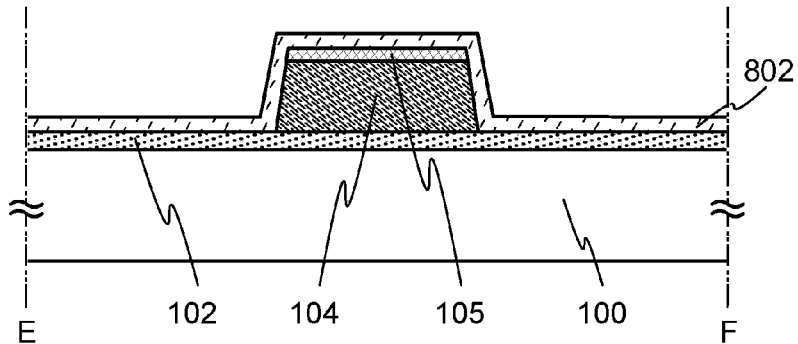
FIGS. 9A to 9C illustrate a method for manufacturing the semiconductor device described in Embodiment 3.

First, the base layer 102 is formed over the substrate 100, the gate electrode 104 and the anti-oxidation layer 105 are formed over the base layer 102, and the gate insulating layer 802 is formed over the base layer 102, the gate electrode 104, and the anti-oxidation layer 105 (see FIG. 9A).

Material qualities, characteristics, formation methods, and the like of the substrate 100, the base layer 102, the gate electrode 104, and the anti-oxidation layer 105 are the same as those in Embodiment 1, and thus detailed description thereof is not repeated here.

As the gate insulating layer 802, a single film or a stacked-layer film containing silicon oxide ($SiO_2$), aluminum oxide ($Al_2O_3$), hafnium oxide ($HfO_2$), hafnium silicate ($HfSiO_2$), hafnium aluminate (HfAlO), zirconium oxide ($ZrO_2$), yttrium oxide ($Y_2O_3$), lanthanum oxide ($La_2O_3$), or cerium oxide (CeO$_2$) as its main component may be formed by a known method such as a CVD method such as a plasma-enhanced CVD method, a PVD method, or a sputtering method.

Alternatively, a single film or a stacked-layer film containing silicon nitride (SiN), silicon oxynitride (SiON), silicon nitride oxide (SiNO), hafnium silicate nitride (HfSiON), or hafnium aluminate nitride (HfAlON) as its main component may be formed by a known method such as a CVD method such as a plasma-enhanced CVD method, a PVD method, or a sputtering method. The gate insulating layer 802 is not limited to a film from which oxygen can be released by heating but can be formed of any kind of film; thus, a variety of high-dielectric constant materials can be used therefor.

As an example, hafnium silicate nitride may be deposited to a thickness of 10 nm by a sputtering method to form the gate insulating layer 802. Such a layer formed by a sputtering method is preferable because the amount of hydrogen, nitrogen, and the like is less.

Figure 9B:
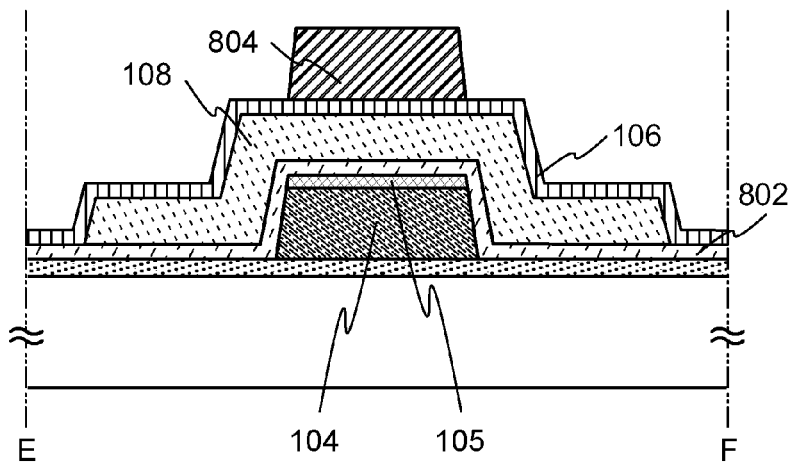

Next, the oxide semiconductor layer 108 is formed over the gate insulating layer 802, the insulating layer 106 is formed over the gate insulating layer 802 and the oxide semiconductor layer 108, and the metal layer 804 is formed over the insulating layer 106 to overlap with the gate electrode 104 (see FIG. 9B). Material qualities, characteristics, formation methods, and the like of the insulating layer 106 and the oxide semiconductor layer 108 are the same as those in Embodiment 1, and thus detailed description thereof is not repeated here.

As the metal layer 804, for example, a layer formed of at least a metal film or an alloy film containing tantalum (Ta), tungsten (W), titanium (Ti), molybdenum (Mo), aluminum (Al), copper (Cu), chromium (Cr), or neodymium (Nd) as its main component or a nitride film of such a metal or an alloy thereof by a known method such as a sputtering method or an evaporation method may be used. The metal layer 804, with which oxygen is added into a region which overlaps with the gate electrode 104 by light irradiation treatment 130 later, needs to be formed to overlap with the gate electrode 104.

Other than the above-described materials, a material having an optical absorptance of 60% or more in the wavelength region from 400 nm to 1000 nm both inclusive can also be used. For example, a metal oxide film of titanium oxide, molybdenum oxide, chromium oxide, cobalt oxide, copper oxide, nickel oxide, magnesium oxide, or the like may be formed by a known method such as a CVD method such as a plasma-enhanced CVD method, a PVD method, or a sputtering method. The metal layer 804, which is not directly involved in operation of the transistor 850, can be formed using any kind of material having the above-described optical absorptance regardless of its electrical characteristics such as a resistance, whereby irradiation light of the light irradiation treatment 130 can be efficiently converted into heat. Accordingly, oxygen can be added into the oxide semiconductor layer in the region which overlaps with the gate electrode 104 efficiently even by low-energy light irradiation, which leads to a reduction in the power consumption of an apparatus for the light irradiation and a reduction in the frequency of maintenance thereof. The metal layer 804 may be used as a second gate electrode such that a dual-gate semiconductor device is formed.

As an example, molybdenum oxide may be deposited to a thickness of 200 nm by a sputtering method to form the metal layer 804.

Figure 9C:
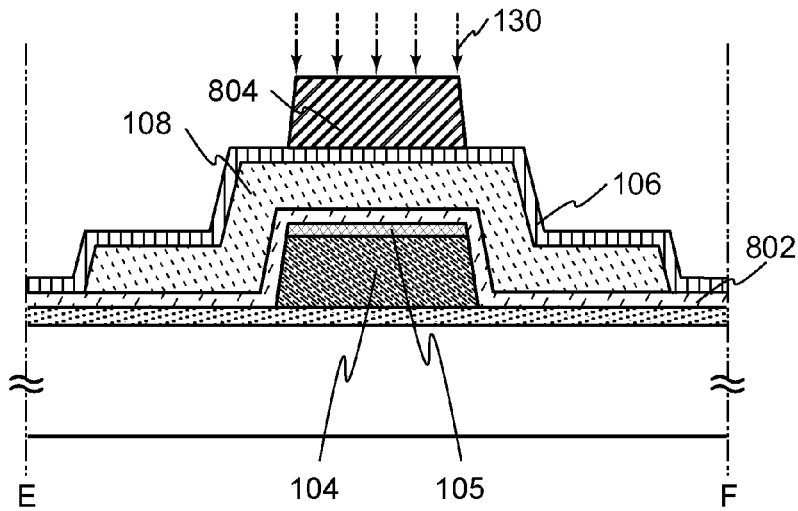

Next, the light irradiation treatment 130 is performed on the metal layer 804 (see FIG. 9C). That light is absorbed in the metal layer 804 to heat the metal layer 804. The insulating layer 106 in a region which overlaps with the metal layer 804 is accordingly heated to release oxygen contained in the insulating layer 106. Part of released oxygen is added into the oxide semiconductor layer 108 especially in the region which overlaps with the gate electrode 104 since the metal layer 804 overlaps with the gate electrode 104 and is in contact with the oxide semiconductor layer 108. Although the light irradiation treatment 130 is performed on the metal layer 804 in this embodiment, the light irradiation treatment 130 may be performed on the entire surface of the substrate. An apparatus, a method, and the like of the light irradiation treatment 130 are the same as those in Embodiment 1, and thus detailed description thereof is not repeated here.

Figure 10A:
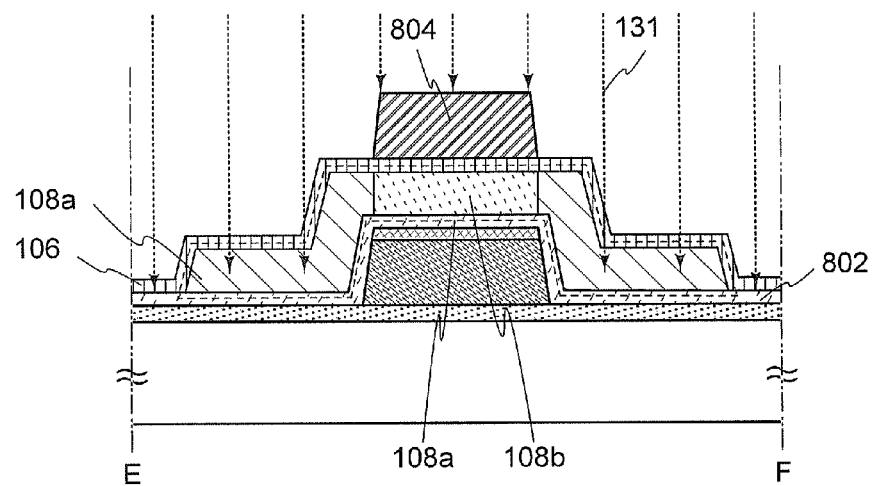
FIGS. 10A and 10B illustrate a method for manufacturing the semiconductor device described in Embodiment 3.

Next, impurity addition treatment 131 is performed thereon using the metal layer 804 as a mask, so that the low resistance region 108a which functions as the source region (or the drain region) and the channel formation region 108b are formed in the oxide semiconductor layer 108 (see FIG. 10A). An apparatus, a method, and the like of the impurity addition treatment 131 are the same as those in Embodiment 1, and thus detailed description thereof is not repeated here.

Figure 10B:
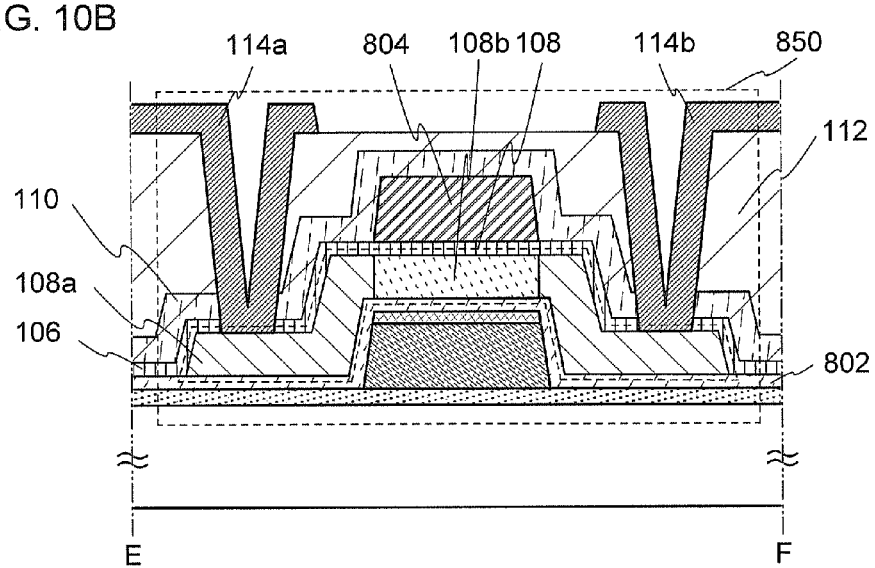

Next, over the insulating layer 106 and the metal layer 804, the first interlayer insulating layer 110 and the second interlayer insulating layer 112 are formed, openings are formed in the insulating layer 106, the first interlayer insulating layer 110, and the second interlayer insulating layer 112, and then, the source electrode 114a which is electrically connected to the low resistance region 108a through the opening and the drain electrode 114b which is electrically connected to the low resistance region 108a through the opening are formed (FIG. 10B). Material qualities, characteristics, formation methods, and the like of the first interlayer insulating layer 110, the second interlayer insulating layer 112, the source electrode 114a, and the drain electrode 114b are the same as those in Embodiment 1, and thus detailed description thereof is not repeated here.

The first interlayer insulating layer 110, which is formed over the insulating layer 106 and the metal layer 804 in this embodiment, is not necessarily provided. Further, although the first interlayer insulating layer 110 and the second interlayer insulating layer 112 each have a single-layer structure in this embodiment, a stacked-layer structure of two or more layers may be employed as well. A material quality and a structure of an interlayer insulating layer may be selected as appropriate considering the use application or requisite characteristics of the transistor 850.

Through the above-described process, the semiconductor device that is the bottom-gate transistor 850 as shown in FIG. 8B can be manufactured, which includes the substrate 100, the base layer 102 formed over the substrate 100, the gate electrode 104 formed over the base layer 102, the anti-oxidation layer 105 formed over the gate electrode 104, the gate insulating layer 802 formed over the base layer 102, the gate electrode 104, and the anti-oxidation layer 105, the oxide semiconductor layer 108 which includes the low resistance region 108a functioning as the source region (or the drain region) and the channel formation region 108b and is formed over the gate insulating layer 802, the insulating layer 106 formed over the oxide semiconductor layer 108 and the gate insulating layer 802, the metal layer 804 formed over the insulating layer 106, the first interlayer insulating layer 110 formed over the insulating layer 106 and the metal layer 804, the second interlayer insulating layer 112 formed over the first interlayer insulating layer 110, and the source electrode 114a and the drain electrode 114b which are electrically connected to the low resistance region 108a through the openings in the insulating layer 106, the first interlayer insulating layer 110, and the second interlayer insulating layer 112.

Although not shown, the gate electrode 104 is electrically led over the second interlayer insulating layer 112 through a conductive wiring via a contact hole which is formed in the gate insulating layer 802, the insulating layer 106, the first interlayer insulating layer 110, and the second interlayer insulating layer 112.

<Effect of Semiconductor Device Manufactured According to this Embodiment>

In the transistor 850 shown in FIGS. 8A and 8B, which is manufactured through the above-described process, not only the metal layer 804 but also the insulating layer 106 in the region which overlaps with the metal layer 804 is heated by the light irradiation treatment 130, so that oxygen contained in the insulating layer is released. That oxygen released from the insulating layer 106 is added into the oxide semiconductor layer 108, which is in contact with the insulating layer 106, in the region which overlaps with the gate electrode 104 since the gate electrode 104 overlaps with the metal layer 804. Accordingly, oxygen vacancies or interface states in the oxide semiconductor layer 108 in the region which overlaps with the gate electrode 104 can be reduced.

In this manner, according to the method described in this embodiment, a highly reliable semiconductor device with less change in the threshold voltage can be manufactured.

The metal layer 804 is not directly involved in operation of the semiconductor device unlike the gate electrode 104; thus, any material which generates heat effectively by the light irradiation treatment 130 can be used for the metal layer 804 regardless of its resistance or thickness, which allows the energy of the light irradiation treatment 130 to be low. Accordingly, a highly reliable semiconductor device with less change in threshold voltage can be manufactured at lower cost.

Further, the metal layer 804 can also be used as a mask for the impurity addition treatment 131 to form the low resistance region 108a which functions as the source region (or the drain region) and the channel formation region 108b in the oxide semiconductor layer 108 in a self-aligned manner, in addition to the function for heating of the insulating layer 106. Accordingly, the manufacturing process of a semiconductor device can be simplified.

Accordingly, according to the method described in this embodiment, a highly reliable semiconductor device with less change in the threshold voltage can be manufactured at lower cost.

Further, the metal layer 804 also acts to suppress incidence of external light into the oxide semiconductor layer in the region which overlaps with the gate electrode 104 (acts as a so-called light-blocking film). Accordingly, a highly reliable semiconductor device with less change in characteristics due to light incidence from outside can be manufactured.

[Embodiment 4]

In Embodiment 4, a semiconductor device in which the position of the metal layer 804 is different from Embodiment 3 is described using FIGS. 11A and 11B, FIGS. 12A to 12C, and FIG. 13. In the structure of this embodiment described below, portions which are the same as or have functions similar to those (functions) in Embodiment 1 or 3 are denoted by the same reference numerals in the drawings, and the description thereof is not repeated.

<Structure of Semiconductor Device According to this Embodiment>

Figure 11A:
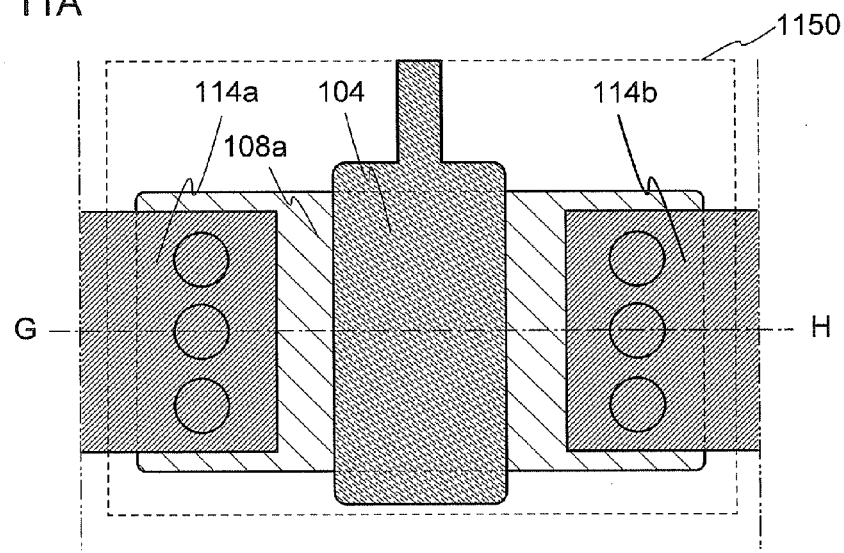
FIGS. 11A and 11B illustrate a structure of a semiconductor device described in Embodiment 4.
Figure 11B:
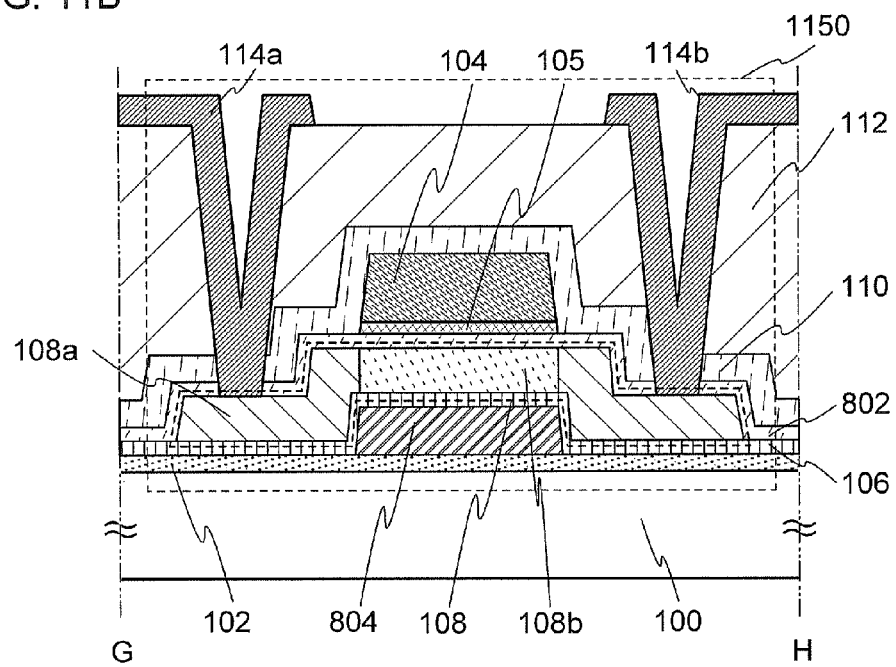

FIGS. 11A and 11B illustrate an example of a structure of a semiconductor device manufactured according to a method of this embodiment, a top-gate transistor 1150: FIG. 11A is a top view of the transistor 1150 and FIG. 11B is a cross-sectional schematic diagram taken along a dashed line G-H in FIG. 11A. In the top view of FIG. 11A, only patterned film(s) and/or layer(s) are shown for easy understanding of the structure. Although the manufacturing method is described on the case where the transistor 1150 is an n-channel transistor whose carriers are electrons in this embodiment, one embodiment of the present invention is not limited to the case of an n-channel transistor.

The transistor 1150 shown in FIGS. 11A and 11B includes a substrate 100, a base layer 102 formed over the substrate 100, a metal layer 804 formed over the base layer 102, an insulating layer 106 formed over the base layer 102 and the metal layer 804, an oxide semiconductor layer 108 which includes a low resistance region 108a functioning as a source region (or a drain region) and a channel formation region 108b and is formed over the insulating layer 106, a gate insulating layer 802 formed over the insulating layer 106 and the oxide semiconductor layer 108, an anti-oxidation layer 105 formed over the gate insulating layer 802, a gate electrode 104 formed over the anti-oxidation layer 105, a first interlayer insulating layer 110 formed over the gate insulating layer 802, the anti-oxidation layer 105, and the gate electrode 104, a second interlayer insulating layer 112 formed over the first interlayer insulating layer 110, and a source electrode 114a and a drain electrode 114b which are electrically connected to the low resistance region 108a through openings in the first interlayer insulating layer 110, the second interlayer insulating layer 112, and the gate insulating layer 802.

<Manufacturing Method of Semiconductor Device According to this Embodiment>

A method for manufacturing the transistor 1150 is described below using FIGS. 12A to 12C and FIG. 13.

Figure 12A:
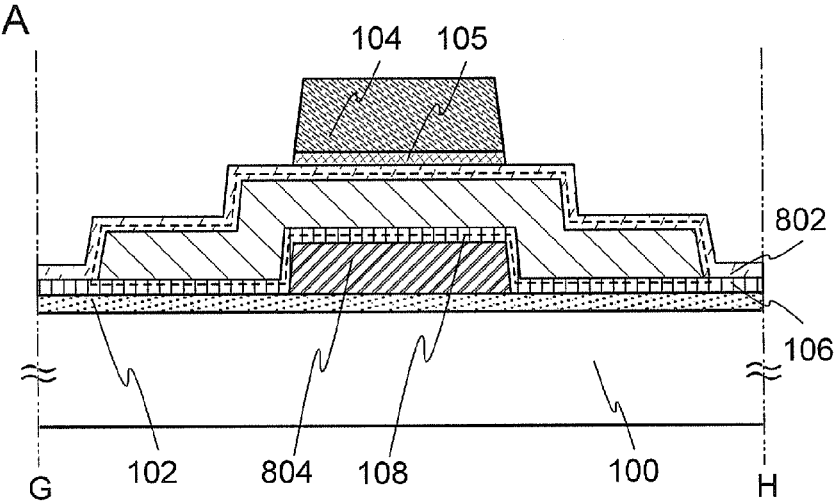
FIGS. 12A to 12C illustrate a method for manufacturing the semiconductor device described in Embodiment 4.

First, the base layer 102 is formed over the substrate 100, the metal layer 804 is formed over the base layer 102, the insulating layer 106 is formed over the base layer 102 and the metal layer 804, the oxide semiconductor layer 108 is formed over the insulating layer 106, the gate insulating layer 802 is formed over the insulating layer 106 and the oxide semiconductor layer 108, and the anti-oxidation layer 105 and the gate electrode 104 are formed over the gate insulating layer 802 (see FIG. 12A). Material qualities, characteristics, formation methods, and the like of the substrate 100, the base layer 102, the metal layer 804, the insulating layer 106, the oxide semiconductor layer 108, the gate insulating layer 802, the anti-oxidation layer 105, and the gate electrode 104 are the same as those in Embodiment 3, and thus detailed description thereof is not repeated here.

Figure 12B:
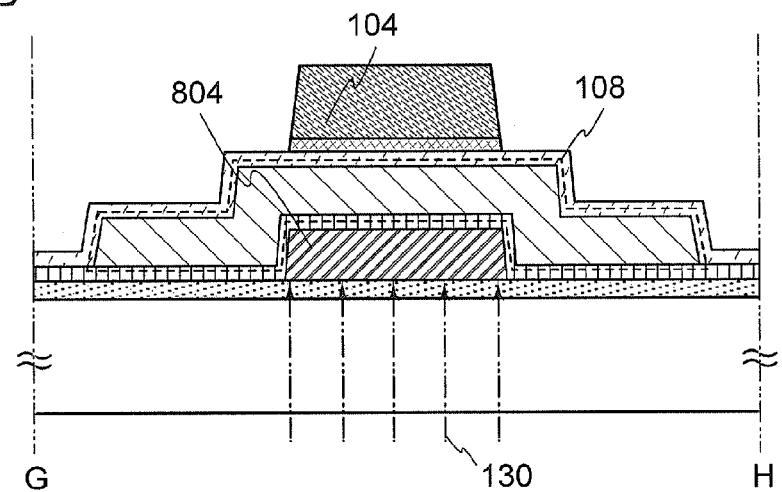

Next, light irradiation treatment 130 is performed on the metal layer 804 (see FIG. 12B). Accordingly, oxygen is added into the oxide semiconductor layer 108 in a region which overlaps with the gate electrode 104, like in Embodiment 3. Although the light irradiation treatment 130 is performed on the metal layer 804 in this embodiment, the light irradiation treatment 130 may be performed on the entire surface of the substrate. An apparatus, a method, and the like of the light irradiation treatment 130 are the same as those in Embodiment 1, and thus detailed description thereof is not repeated here.

Figure 12C:
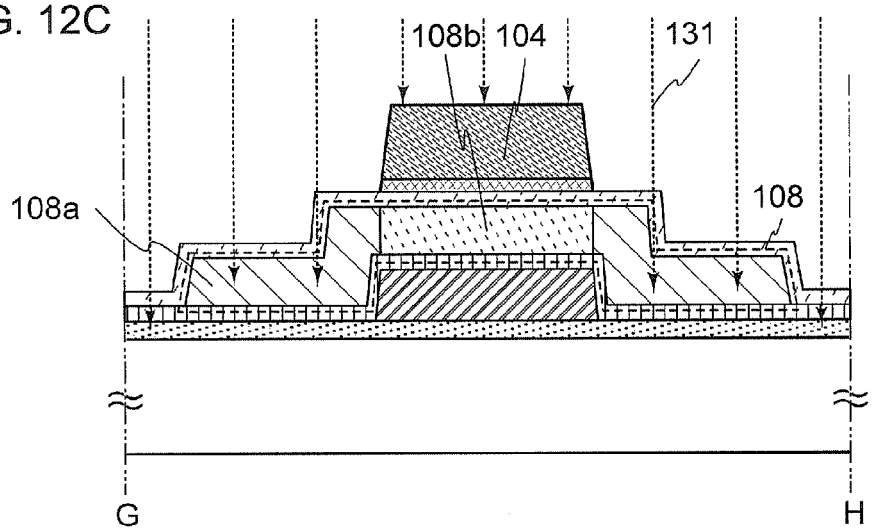

Next, impurity addition treatment 131 is performed thereon using the gate electrode 104 as a mask, so that the low resistance region 108a which functions as the source region (or the drain region) and the channel formation region 108b are formed in the oxide semiconductor layer 108 (see FIG. 12C). An apparatus, a method, and the like of the impurity addition treatment 131 are the same as those in Embodiment 1, and thus detailed description thereof is not repeated here.

Figure 13:
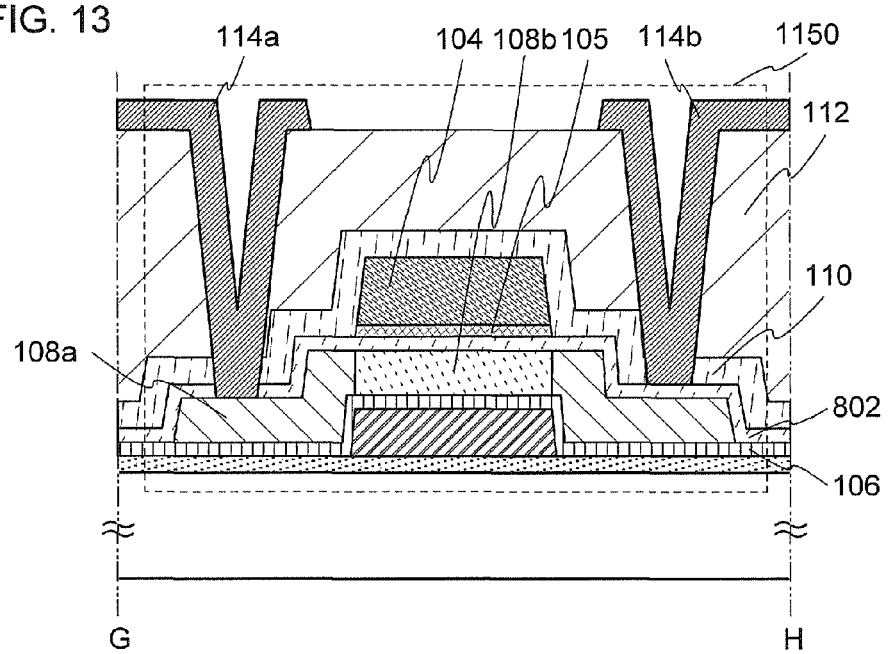
FIG. 13 illustrates a method for manufacturing the semiconductor device described in Embodiment 4.

Next, over the gate insulating layer 802, the anti-oxidation layer 105, and the gate electrode 104, the first interlayer insulating layer 110 and the second interlayer insulating layer 112 are formed, openings are formed in the first interlayer insulating layer 110, the second interlayer insulating layer 112, and the gate insulating layer 802, and then, the source electrode 114a which is electrically connected to the low resistance region 108a through the opening and the drain electrode 114b which is electrically connected to the low resistance region 108a through the opening are formed (FIG. 13). Material qualities, characteristics, formation methods, and the like of the first interlayer insulating layer 110, the second interlayer insulating layer 112, the source electrode 114a, and the drain electrode 114b are the same as those in Embodiment 1, and thus detailed description thereof is not repeated here.

The first interlayer insulating layer 110, which is formed over the gate insulating layer 802, the anti-oxidation layer 105, and the gate electrode 104 in this embodiment, is not necessarily provided. Further, although the first interlayer insulating layer 110 and the second interlayer insulating layer 112 each have a single-layer structure in this embodiment, a stacked-layer structure of two or more layers may be employed as well. A material quality and a structure of an interlayer insulating layer may be selected as appropriate considering the use application or requisite characteristics of the transistor 1150.

Through the above-described process, the semiconductor device that is the top-gate transistor 1150 as shown in FIG. 11B can be manufactured, which includes the substrate 100, the base layer 102 formed over the substrate 100, the metal layer 804 formed over the base layer 102, the insulating layer 106 formed over the base layer 102 and the metal layer 804, the oxide semiconductor layer 108 which includes the low resistance region 108a functioning as the source region (or the drain region) and the channel formation region 108b and is formed over the insulating layer 106, the gate insulating layer 802 formed over the insulating layer 106 and the oxide semiconductor layer 108, the anti-oxidation layer 105 formed over the gate insulating layer 802, the gate electrode 104 formed over the anti-oxidation layer 105, the first interlayer insulating layer 110 formed over the gate insulating layer 802, the anti-oxidation layer 105, and the gate electrode 104, the second interlayer insulating layer 112 formed over the first interlayer insulating layer 110, and the source electrode 114a and the drain electrode 114b which are electrically connected to the low resistance region 108a through the openings in the first interlayer insulating layer 110 and the second interlayer insulating layer 112.

<Effect of Semiconductor Device Manufactured According to this Embodiment>

In the transistor 1150 shown in FIGS. 11A and 11B, which is manufactured through the above-described process, not only the metal layer 804 but also the insulating layer 106 in the region which overlaps with the metal layer 804 is heated by the light irradiation treatment 130, so that oxygen contained in the insulating layer is released. That oxygen released from the insulating layer 106 is added into the oxide semiconductor layer 108, which is in contact with the insulating layer 106, in the region which overlaps with the gate electrode 104 since the gate electrode 104 overlaps with the metal layer 804. Accordingly, oxygen vacancies or interface states in the oxide semiconductor layer 108 in the region which overlaps with the gate electrode 104 can be reduced.

In this manner, according to the method described in this embodiment, a highly reliable semiconductor device with less change in the threshold voltage can be manufactured.

The metal layer 804 is not directly involved in operation of the semiconductor device unlike the gate electrode 104; thus, any material which generates heat effectively by the light irradiation treatment 130 can be used for the metal layer 804 regardless of its resistance or thickness, which allows the energy of the light irradiation treatment 130 to be low. Accordingly, a highly reliable semiconductor device with less change in threshold voltage can be manufactured at lower cost.

Further, the gate electrode 104 can also be used as a mask for the impurity addition treatment 131 to form the low resistance region 108a functioning as the source region (or the drain region) and the channel formation region 108b in the oxide semiconductor layer 108 in a self-aligned manner, in addition to the function for heating of the insulating layer 106. Accordingly, the manufacturing process of a semiconductor device can be simplified.

Accordingly, according to the method described in this embodiment, a highly reliable semiconductor device with less change in the threshold voltage can be manufactured at lower cost.

Further, the metal layer 804 also acts to suppress incidence of external light into the oxide semiconductor layer in the region which overlaps with the gate electrode 104 (acts as a so-called light-blocking film), in addition to the function of heating of the insulating layer 106. Accordingly, a highly reliable semiconductor device with less change in characteristics due to light incidence from outside can be manufactured.

[Embodiment 5]

An oxide semiconductor element disclosed in this specification can be applied to a variety of electronic devices (including game machines). Examples of the electronic devices are a television device, a monitor of a computer or the like, a camera such as a digital camera or a digital video camera, a digital photo frame, a mobile phone (also referred to as a cellular phone or a cellular phone device), a portable game console, a handheld terminal, an audio reproducing device, a large-sized game machine such as a pachinko machine, and the like. Examples of electronic devices including the oxide semiconductor element described in any of the above embodiments are described using FIGS. 14A to 14C.

Figure 14A:
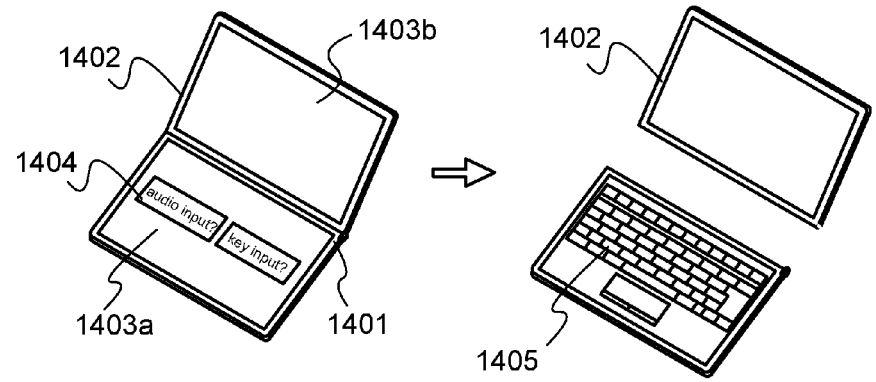
FIGS. 14A to 14C illustrate modes of an electronic device using a semiconductor device in accordance with one embodiment of the present invention.

FIG. 14A illustrates a handheld terminal including a main body 1401, a housing 1402, a first display portion 1403a, and a second display portion 1403b. The first display portion 1403a is a touch panel, and for example, as shown in the left in FIG. 14A, which of "voice input" and "key input" is performed can be selected by a selection button 1404 displayed on the first display portion 1403a. The selection button can be displayed with a variety of sizes, which is easy to use for people of any generation. When "key input" is selected, for example, a keyboard 1405 is displayed on the first display portion 1403a as shown in the right in FIG. 14A; accordingly, letters can be input quickly by keyboard input as in conventional handheld terminals, for example.

Further, either of the first display portion 1403a and the second display portion 1403b can be detached from the handheld terminal as shown in the right in FIG. 14A. For example, the second display portion 1403*b* can function as a touch panel for a reduction in weight to carry around to be operated by one hand while the other hand supports the housing 1402, which is very convenient.

Further, the handheld terminal shown in FIG. 14A can be equipped with a function of displaying a variety of information (e.g., a still image, a moving image, and a text image) on the display portion; a function of displaying a calendar, a date, the time, or the like on the display portion; a function of operating or editing the information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The handheld terminal shown in FIG. 14A may be structured to transmit and receive data wirelessly. Through wireless communication, desired book data or the like can be purchased and downloaded from an electronic book server.

Further, the housing 1402 shown in FIG. 14A may be equipped with an antenna, a microphone function, or a wireless communication function to be used as a mobile phone.

Figure 14B:
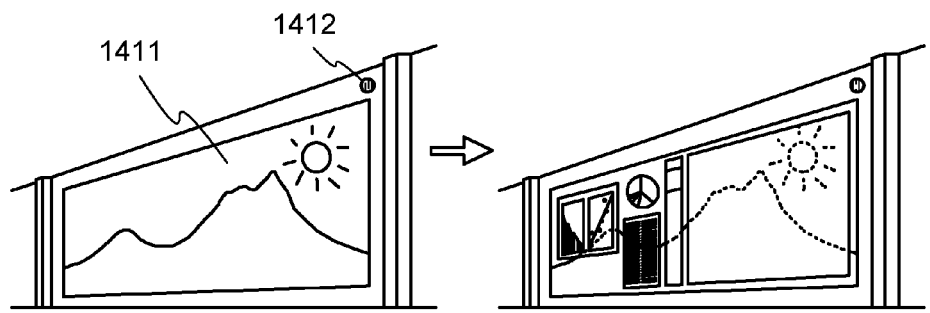

FIG. 14B illustrates one mode of an image display device. The image display device illustrated in FIG. 14B includes a display portion 1411 which functions as a window glass equipped with a touch-input function. Since the oxide semiconductor layer 108 used in the method for manufacturing a semiconductor device disclosed in this specification has light-transmitting properties, the display portion 1411 can be formed with a sufficient transmittance of visible light (e.g., 50% or more) which allows us to view the outside sight by using a light-transmitting substrate (e.g., alkali-free glass) as the substrate 100 and micro-wiring. Thus, for example, the display portion 1411 functions as a window glass in a normal state as shown in the left in FIG. 14B, and necessary data can be displayed on the display portion 1411 as shown in the right in FIG. 14B by touching a surface of the display portion 1411.

Further, a unit for wirelessly transmitting and receiving data (hereinafter abbreviated as a wireless unit) may be provided in part of an internal circuit of the display portion 1411. Accordingly, for example, with a piezoelectric vibrator 1412 having a wireless unit provided in the image display device, an audio signal transmitted from the wireless unit in part of the internal circuit of the display portion 1411 can be received by the wireless unit of the piezoelectric vibrator 1412 to vibrate the piezoelectric vibrator 1412, whereby the display portion 1411 can be vibrated to emit sound with a stable volume uniformly.

Figure 14C:
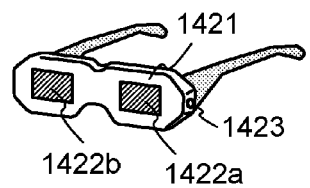
Figure 14C:
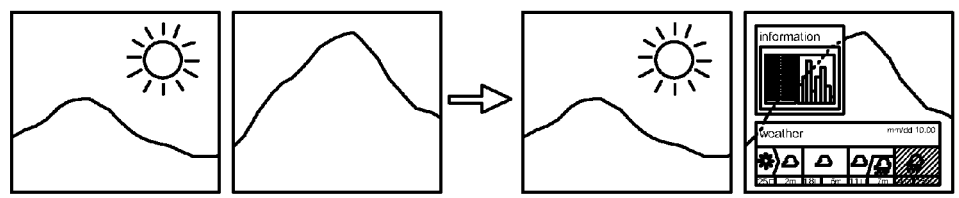

FIG. 14C illustrates one mode of a goggle-type display (head mounted display). In an image display device shown in FIG. 14C, a left-eye panel 1422*a*, a right-eye panel 1422*b*, and an image display button 1423 are provided for a main body 1421. Since the oxide semiconductor layer 108 used in the method for manufacturing a semiconductor device disclosed in this specification has light-transmitting properties, the panels can be formed with a sufficient transmittance of visible light (e.g., 50% or more) by using a light-transmitting substrate (e.g., alkali-free glass) as the substrate 100 and micro-wiring. Consequently, we can view the outside sight through the left-eye panel 1422*a* and the right-eye panel 1422*b*, so that we can view the sight as with normal eye glasses, as shown in the bottom left in FIG. 14A. Further, to obtain necessary data, we push an image display button 1423, so that an image is displayed on one or both of the left-eye panel 1422*a* and the right-eye panel 1422*b* as shown in the bottom right in FIG. 14C.

The methods, structures, and the like described in this embodiment can be combined as appropriate with any of the methods, structures, and the like described in the other embodiments.

This application is based on the Japanese Patent Application serial No. 2011-047879 filed with Japan Patent Office on Mar. 4, 2011, the entire contents of which are hereby incorporated by reference.

What is claimed is:

1. A method for manufacturing a semiconductor device, comprising the steps of:
    forming a gate electrode over a substrate having an insulating surface;
    forming an anti-oxidation layer on and in contact with the gate electrode, the anti-oxidation layer containing at least one of molybdenum nitride, tungsten nitride, titanium nitride, tantalum nitride, and aluminum nitride;
    forming an insulating layer over the gate electrode and the anti-oxidation layer;
    forming an oxide semiconductor layer in contact with the insulating layer; and
    performing a light irradiation treatment on at least the gate electrode, whereby oxygen released from the insulating layer is added to the oxide semiconductor layer.

2. The method for manufacturing a semiconductor device according to claim 1, wherein the insulating layer is formed by a sputtering method using oxygen or a mixed gas of oxygen and argon.

3. A method for manufacturing a semiconductor device, comprising the steps of:
    forming an oxide semiconductor layer over a substrate having an insulating surface;
    forming an insulating layer in contact with the oxide semiconductor layer;
    forming an anti-oxidation layer over the insulating layer, the anti-oxidation layer containing at least one of molybdenum nitride, tungsten nitride, titanium nitride, tantalum nitride, and aluminum nitride;
    forming a gate electrode over the insulating layer and on and in contact with the anti-oxidation layer; and
    performing a light irradiation treatment on at least the gate electrode, whereby oxygen released from the insulating layer is added to the oxide semiconductor layer.

4. The method for manufacturing a semiconductor device according to claim 3, wherein the insulating layer is formed by a sputtering method using oxygen or a mixed gas of oxygen and argon.

5. A method for manufacturing a semiconductor device, comprising the steps of:
    forming a gate electrode over a substrate having an insulating surface;
    forming an anti-oxidation layer on and in contact with the gate electrode, the anti-oxidation layer containing at least one of molybdenum nitride, tungsten nitride, titanium nitride, tantalum nitride, and aluminum nitride;
    forming a gate insulating layer over the substrate and the anti-oxidation layer;
    forming an oxide semiconductor layer over the gate insulating layer;
    forming an insulating layer in contact with the oxide semiconductor layer to overlap with the gate electrode;
    forming a metal layer over the insulating layer to overlap with the insulating layer and the gate electrode;

forming a source electrode and a drain electrode in electrical contact with the oxide semiconductor layer; and performing a light irradiation treatment on at least the metal layer, whereby oxygen released from the insulating layer is added to the oxide semiconductor layer.

6. The method for manufacturing a semiconductor device according to claim 5, wherein a layer having an optical absorptance of 60% or more in a wavelength region from 400 nm to 1000 nm both inclusive, is formed as the metal layer.

7. The method for manufacturing a semiconductor device according to claim 5, wherein the insulating layer is formed by a sputtering method using oxygen or a mixed gas of oxygen and argon.

8. A method for manufacturing a semiconductor device, comprising the steps of:

forming an island-shaped metal layer over a substrate having an insulating surface;

forming an insulating layer over the island-shaped metal layer;

forming an oxide semiconductor layer in contact with the insulating layer;

forming a gate insulating layer over the oxide semiconductor layer;

forming an anti-oxidation layer over the gate insulating layer, the anti-oxidation layer containing at least one of molybdenum nitride, tungsten nitride, titanium nitride, tantalum nitride, and aluminum nitride;

forming a gate electrode over the gate insulating layer and on and in contact with the anti-oxidation layer, so as to overlap with the island-shaped metal layer and the insulating layer;

forming a source electrode and a drain electrode in electrical contact with the oxide semiconductor layer; and performing a light irradiation treatment on at least the island-shaped metal layer, whereby oxygen released from the insulating layer is added to the oxide semiconductor layer.

9. The method for manufacturing a semiconductor device according to claim 8, wherein a layer having an optical absorptance of 60% or more in a wavelength region from 400 nm to 1000 nm both inclusive, is formed as the island-shaped metal layer.

10. The method for manufacturing a semiconductor device according to claim 8, wherein the insulating layer is formed by a sputtering method using oxygen or a mixed gas of oxygen and argon.

11. The method for manufacturing a semiconductor device according to claim 1, wherein the insulating layer is a single film or a stacked-layer film containing silicon oxide, aluminum oxide, hafnium oxide, hafnium silicate, hafnium aluminate, zirconium oxide, yttrium oxide, lanthanum oxide, or cerium oxide.

12. The method for manufacturing a semiconductor device according to claim 3, wherein the insulating layer is a single film or a stacked-layer film containing silicon oxide, aluminum oxide, hafnium oxide, hafnium silicate, hafnium aluminate, zirconium oxide, yttrium oxide, lanthanum oxide, or cerium oxide.

13. The method for manufacturing a semiconductor device according to claim 5, wherein the insulating layer is a single film or a stacked-layer film containing silicon oxide, aluminum oxide, hafnium oxide, hafnium silicate, hafnium aluminate, zirconium oxide, yttrium oxide, lanthanum oxide, or cerium oxide.

14. The method for manufacturing a semiconductor device according to claim 8, wherein the insulating layer is a single film or a stacked-layer film containing silicon oxide, aluminum oxide, hafnium oxide, hafnium silicate, hafnium aluminate, zirconium oxide, yttrium oxide, lanthanum oxide, or cerium oxide.

15. The method for manufacturing a semiconductor device according to claim 1, wherein the insulating layer is formed by a sputtering method using oxygen-excess silicon oxide, $SiO_X$ with X greater than 2, as a target.

16. The method for manufacturing a semiconductor device according to claim 3, wherein the insulating layer is formed by a sputtering method using oxygen-excess silicon oxide, $SiO_X$ with X greater than 2, as a target.

17. The method for manufacturing a semiconductor device according to claim 5, wherein the insulating layer is formed by a sputtering method using oxygen-excess silicon oxide, $SiO_X$ with X greater than 2, as a target.

18. The method for manufacturing a semiconductor device according to claim 8, wherein the insulating layer is formed by a sputtering method using oxygen-excess silicon oxide, $SiO_X$ with X greater than 2, as a target.

* * * * *